United States Patent
Brunner

(10) Patent No.: US 9,411,223 B2
(45) Date of Patent: Aug. 9, 2016

(54) ON-PRODUCT FOCUS OFFSET METROLOGY FOR USE IN SEMICONDUCTOR CHIP MANUFACTURING

(75) Inventor: Timothy A. Brunner, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 700 days.

(21) Appl. No.: 13/608,455

(22) Filed: Sep. 10, 2012

(65) Prior Publication Data

US 2014/0071415 A1     Mar. 13, 2014

(51) Int. Cl.
*G03B 27/52* (2006.01)
*G03F 1/50* (2012.01)
*G03F 7/20* (2006.01)

(52) U.S. Cl.
CPC .............. *G03F 1/50* (2013.01); *G03F 7/70641* (2013.01)

(58) Field of Classification Search
CPC ..... G06K 7/0095; G03F 7/70641; G03F 1/28; G03F 7/20; G03F 1/56; G03F 1/14; G03F 1/44; G01M 11/0264; G03B 27/00
See application file for complete search history.

(56) References Cited

U.S. PATENT DOCUMENTS

| | | | |
|---|---|---|---|
| 5,300,786 A | 4/1994 | Brunner et al. | |
| 5,673,103 A * | 9/1997 | Inoue et al. | 355/71 |
| 5,936,738 A | 8/1999 | Liebmann et al. | |
| 6,057,908 A * | 5/2000 | Ota | 355/55 |
| 6,063,531 A | 5/2000 | Singh et al. | |
| 6,440,616 B1 | 8/2002 | Izuha et al. | |
| 6,674,511 B2 | 1/2004 | Nomura et al. | |
| 6,710,853 B1 | 3/2004 | La Fontaine et al. | |
| 6,811,939 B2 | 11/2004 | Nakao et al. | |
| 6,974,653 B2 | 12/2005 | Leung et al. | |
| 7,108,945 B2 | 9/2006 | Sutani et al. | |

(Continued)

FOREIGN PATENT DOCUMENTS

| | | |
|---|---|---|
| CN | 1782867 A | 6/2006 |
| CN | 101561633 A | 10/2009 |
| JP | 2002-151377 A | 5/2002 |

OTHER PUBLICATIONS

Tirapu-Azpiroz, J. et al., "Boundary Layer Model to Account for Thick Mask Effects in Photolithography" Proceedings of the SPIE Optical Microlithography XVI (Feb. 23, 2003) pp. 1611-1619, vol. 5040.

(Continued)

*Primary Examiner* — Mesfin T Asfaw
(74) *Attorney, Agent, or Firm* — Scully Scott Murphy and Presser

(57) ABSTRACT

A focus monitor structure on a reticle includes a lithographic feature region, a horizontal grating region including a horizontal grating located on one side of the lithographic feature region, and a vertical grating region including a vertical grating located on the opposite side of the lithographic feature region. A polarized illumination beam causes a printed image of the lithographic feature region to shift either toward the direction of the horizontal grating region or toward the direction of the vertical grating region in a manner that depends on the sign of the focus offset of the photoresist layer relative to the lens of an exposure tool. The magnitude and sign of the focus offset can be monitored to provide a real-time feedback on the focus offset of the exposure tool by measuring the shift of the printed image of the lithographic feature region.

22 Claims, 17 Drawing Sheets

(56) References Cited

U.S. PATENT DOCUMENTS

| | | |
|---|---|---|
| 7,175,945 B2 | 2/2007 | Mieher et al. |
| 7,250,235 B2 | 7/2007 | Izuha et al. |
| 7,585,601 B2 | 9/2009 | Brunner et al. |
| 7,824,829 B2 | 11/2010 | Choi |
| 7,855,037 B2 | 12/2010 | Kim |
| 7,864,294 B2 | 1/2011 | Wang et al. |
| 2001/0012098 A1* | 8/2001 | Mishima .......................... 355/53 |
| 2003/0133099 A1* | 7/2003 | Shiode ............................ 356/124 |
| 2005/0208391 A1 | 9/2005 | Mieher et al. |
| 2009/0268182 A1 | 10/2009 | Staals et al. |

OTHER PUBLICATIONS

Office Action issued in U.S. Appl. No. 14/033,593 on Oct. 28, 2015.

* cited by examiner

ON-PRODUCT FOCUS OFFSET METROLOGY FOR USE IN SEMICONDUCTOR CHIP MANUFACTURING

BACKGROUND

The present disclosure relates to metrology methods for measuring the focus variations during lithographic exposure of a photoresist, and reticles including a pattern for implementing the same.

A reticle, or a lithographic mask, comprises a transparent reticle substrate and a patterned optically opaque coating thereupon. Alternatively, a photomask may comprise a transparent reticle substrate with a partially transmissive layer, or with features etched out of the substrate to achieve optical phase shifting by changing the optical path length. The reticle is mounted into an exposure tool, which may be integrated into a tool called a scanner, so that radiation from a source of the exposure tool passes through the reticle and impinges on a photoresist applied to a top surface of a semiconductor substrate. The pattern of the reticle is thus transferred into the photoresist during the exposure so that the photoresist may have the same pattern as the pattern of the reticle after development. The reticle may be repeatedly employed to replicate the pattern in the reticle in the photoresist material on multiple semiconductor substrates. The coating on the reticle is optically opaque at the wavelength of the radiation source. Typical wavelengths of radiation that are employed for photolithography include 365 nm, 248 nm, 193 nm, 157 nm, etc. Such deep ultraviolet (DUV) wavelengths may be employed to pattern features having dimensions of 20 nm or greater in the photoresist.

In order to replicate the pattern of the reticles in a photoresist layer on a substrate with high fidelity, it is necessary that the distance between the lens of the exposure tool and the photoresist layer on the substrate be maintained at an optimal value, which is referred to as an optimal focus. A deviation of the distance between the lens of the exposure tool and the photoresist layer is referred to as a focus offset. Any non-zero value of the focus offset degrades the quality of the lithographic pattern formed in the photoresist layer by photographic exposure and development. The tolerance for the focus offset for forming a usable lithographic image is referred to as a depth of focus (DOF). The greater the DOF, the more immune a lithographic process employing a combination of an exposure tool and a reticle is to variations in the distance between the lens of the exposure tool and the photoresist layer, i.e., to the focus offset.

DOF has been continually decreasing with each generation of semiconductor technology. The DOF for advanced semiconductor technology is on the order of 100 nm as of 2012, and is expected to decrease in the future. In order to provide high yield lithographic processes, therefore, it is necessary to ensure that the distance between the lens of the exposure tool and the photoresist layer on the substrate be maintained at the optimal focus.

BRIEF SUMMARY

A focus monitor structure can be embedded in a reticle to enable monitoring of focus offset between a lens of an exposure tool and a photoresist layer on a substrate. The focus monitor structure includes a lithographic feature region, a horizontal grating region including a horizontal grating located on one side of the lithographic feature region, and a vertical grating region including a vertical grating located on the opposite side of the lithographic feature region. A polarized illumination beam causes a printed image of the lithographic feature region to shift either toward the direction of the horizontal grating region or toward the direction of the vertical grating region in a manner that depends on the sign of the focus offset of the photoresist layer relative to the lens of an exposure tool. The magnitude and sign of the focus offset can be monitored to provide a real-time feedback on the focus offset of the exposure tool by measuring the shift of the printed image of the lithographic feature region.

According to an aspect of the present disclosure, a reticle including a focus monitor structure is provided. The focus monitor structure includes one or more focus monitor units. Each of the one or more focus monitor units includes a lithographic feature region having a same transmission coefficient for electromagnetic radiation throughout, a horizontal grating region located on a first side of the lithographic feature region, and a vertical grating region located on a second side of the lithographic feature region. The second side is the opposite of the first side relative to the lithographic feature region.

According to another aspect of the present disclosure, a reticle including a focus monitor structure is provided. The focus monitor structure includes at least a first focus monitor unit and a second focus monitor unit. The first focus monitor unit includes a first lithographic feature region having a same transmission coefficient throughout for electromagnetic radiation, a first horizontal grating region located on one side of the first lithographic feature region, and a first vertical grating region located on an opposite side of the first lithographic feature region. The second focus monitor unit includes a second lithographic feature region having the same transmission coefficient for electromagnetic radiation throughout, a second vertical grating region located on one side of the second lithographic feature region, and a second horizontal grating region located on an opposite side of the second lithographic feature region. The relative location of the first horizontal grating region with respect to the first lithographic feature region is in the opposite direction of the relative location of the second horizontal grating region with respect to the second lithographic feature region.

According to yet another aspect of the present disclosure, a lithographic system including an exposure tool and a reticle is provided. The exposure tool is configured to print a periodic one-dimensional array of lines and spaces at a pitch not less than a minimum lithographic pitch. The reticle includes a focus monitor structure. The focus monitor structure includes a lithographic feature region having a same transmission coefficient for electromagnetic radiation throughout, a horizontal grating region located on a first side of the lithographic feature region, and a vertical grating region located on a second side of the lithographic feature region. The second side is the opposite of the first side relative to the lithographic feature region.

According to still another aspect of the present disclosure, a method of monitoring a focus offset of a lithographic system is provided. The method includes providing a reticle including a focus monitor structure. The focus monitor structure includes a lithographic feature region having a same transmission coefficient for electromagnetic radiation throughout, a horizontal grating region located on a first side of the lithographic feature region, and a vertical grating region located on a second side of the lithographic feature region. The second side is the opposite of the first side relative to the lithographic feature region. The reticle is loaded in an exposure tool. A photoresist layer on a substrate is lithographically exposed in the exposure tool employing the reticle and at a setting in which the photoresist layer is maintained at a distance from a lens of the exposure tool. A lateral shift of a lithographic pattern of the lithographic feature region due to the horizontal and vertical grating regions is measured. A focus offset of the setting is determined based on the lateral shift.

DETAILED DESCRIPTION

Figure 1A:
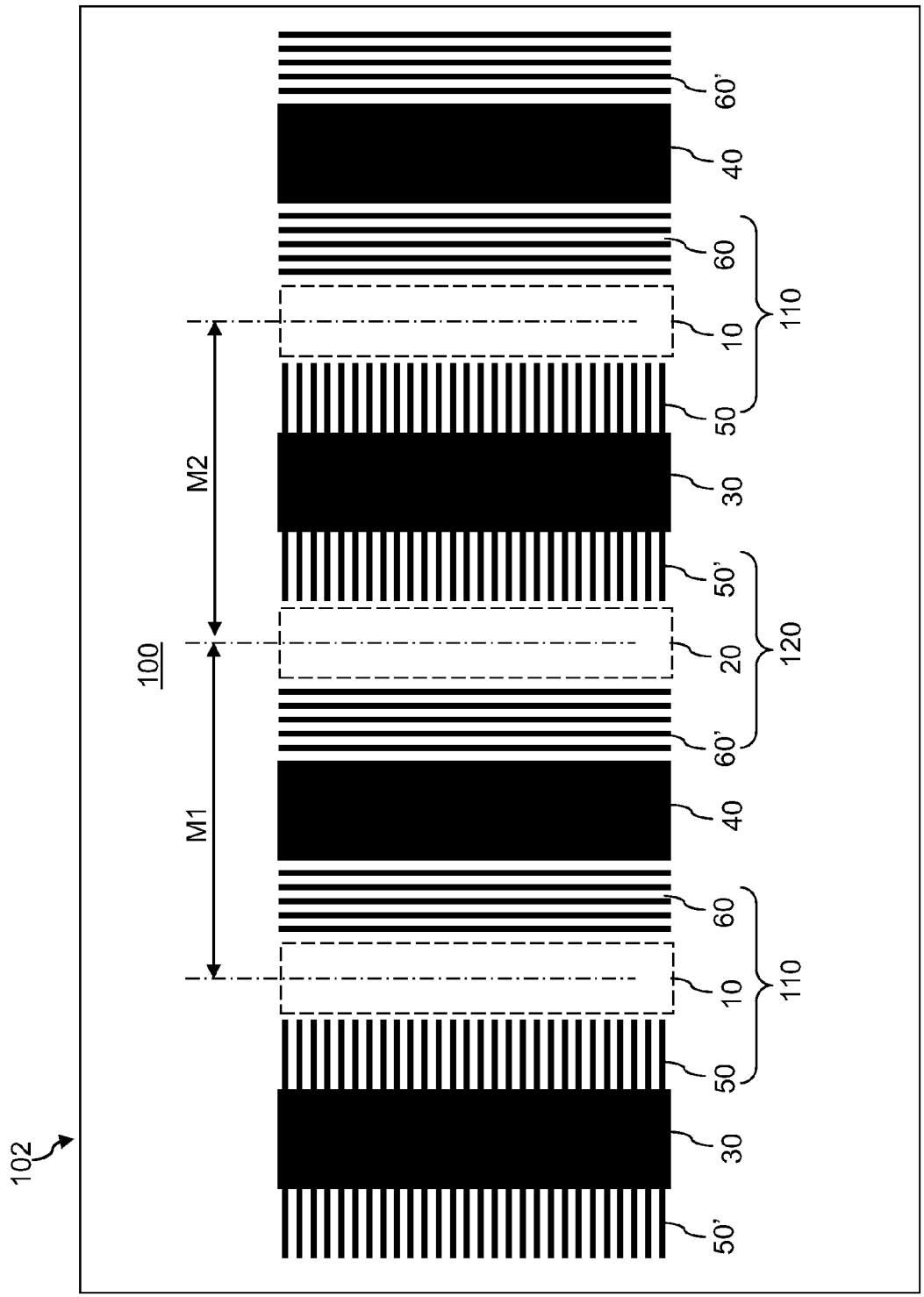
FIG. 1A is a top-down view of a portion of a first exemplary focus monitor structure on a reticle according to an embodiment of the present disclosure.

As stated above, the present disclosure relates to metrology methods for measuring the focus variations during lithographic exposure of a photoresist, and reticles including a pattern for implementing the same, which is now described in detail with accompanying figures. Throughout the drawings, the same reference numerals or letters are used to designate like or equivalent elements. The drawings are not necessarily drawn to scale.

Figure 1B:
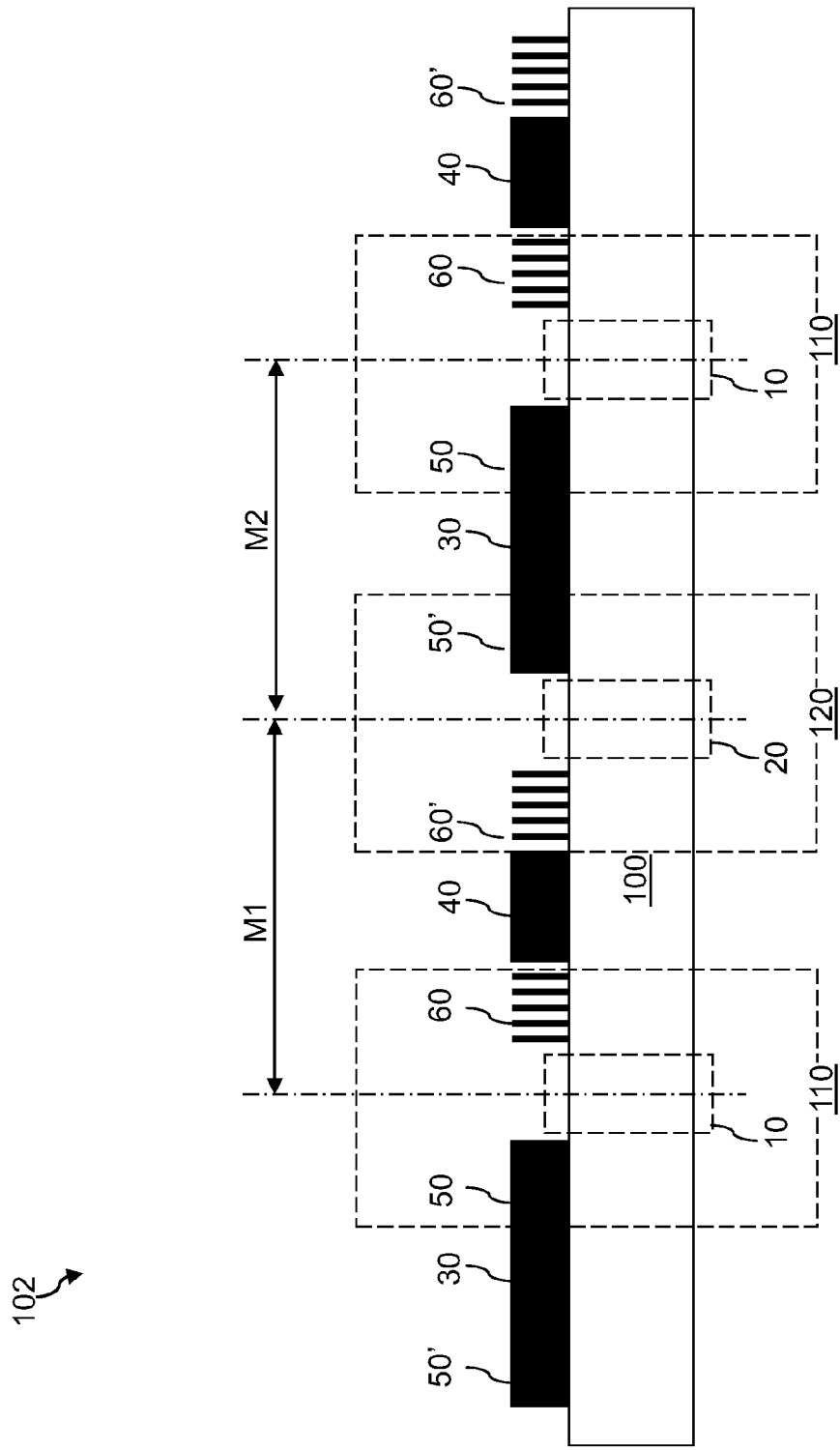
FIG. 1B is a vertical cross-sectional view of the first exemplary focus monitor structure on the reticle of FIG. 1A according to an embodiment of the present disclosure.

Referring to FIGS. 1A and 1B, a first exemplary focus monitor structure on a reticle 102 is shown according to an embodiment of the present disclosure. The reticle 102 can include any type of substrate as known in the art. In one embodiment, the reticle 102 includes a reticle substrate 100 which is a transparent substrate. The reticle 102 can be a chrome-on glass (COG) mask, an opaque MoSi on glass (OMOG) mask, a phase shift mask (PSM), or an attenuated phase shift mask (attenuated PSM) as known in the art. The reticle substrate 100 can have the same thickness throughout the entirety thereof, or can include a region having the same thickness. In one embodiment, the reticle substrate 100 can be transparent throughout the entirety thereof without any trenches therein. As used herein, "transparency" refers to transparency at the illumination wavelength of a lithographic tool, which can be selected from an ultraviolet wavelength range from 157 nm to 450 nm or from an X-ray wavelength range from 1 nm to 10 nm.

The reticle 102 can include at least one focus monitor structure. Each focus monitor structure includes one or more focus monitor units. For example, the focus monitor structure illustrated in FIGS. 1A and 1B can include at least one first focus monitor unit 110 and at least one second focus monitor unit 120.

Each first focus monitor unit 110 can include a first lithographic feature region 10 having a same transmission coefficient throughout for electromagnetic radiation at a wavelength, which can be the wavelength of an electromagnetic radiation of the illumination beam of an exposure tool in which the reticle 102 is to be subsequently employed. The transmission coefficient of the first lithographic feature region 10 can be substantially equal to 1. Thus, the first lithographic feature region 10 can include a first transparent region of the reticle 102. A first horizontal grating region 50 is located on one side of the first lithographic feature region 10. A first vertical grating region 60 is located on the opposite side of the first lithographic feature region 10.

In one embodiment, the reticle 102 can include a patterned opaque layer located on a planar surface of a transparent substrate. In this case, the first horizontal grating region 50 and the first vertical grating region 60 can include portions of the patterned opaque layer. Specifically, a first horizontal grating within the first horizontal grating region 50 can be an array of horizontal lines of the patterned opaque layer, and a first vertical grating within the first vertical grating region 60 can be an array of vertical lines of the patterned opaque layer. The first lithographic feature region 10 can be a region in which portions of the patterned opaque layer are not present, thereby providing the maximum transparency that the reticle 102 can provide.

The horizontal grating of the first horizontal grating region 50 is a subresolution grating, i.e., a grating that does not resolve as an image pattern within the photoresist. Instead the subresolution grating images like a partially transmitting region, or a grey scale area. By choosing the pitch <0.5λ/NA, the first horizontal grating region 50 is guaranteed not to resolve as a printed grating. Here λ is the exposure wavelength used by the exposure tool and NA is the Numerical Aperture of the exposure tool optics. The duty cycle of the grating is defined to be the ratio of the absorber width to the grating pitch. By choosing the width of the line for the first horizontal grating region 50, and hence the duty cycle of the horizontal grating, one is able to control the grey scale level. The duty cycle for the first horizontal grating region 50 typically ranges between 20% and 75%. EMF effects will cause the grey scale image to act like a weak phase shifter.

The vertical grating of the first vertical grating region 60 is a subresolution grating. As in the case of the first horizontal grating region 50, by choosing the pitch <0.5λ/NA, the first vertical grating region 60 is guaranteed not to resolve as a printed grating. By choosing the width of the line for the first vertical grating region 60, and hence the duty cycle of the vertical grating, one is able to control the grey scale level. The duty cycle for the first vertical grating region 60 typically ranges between 20% and 75%. EMF effects will cause the grey scale image to act like a weak phase shifter.

In one embodiment, the first lithographic feature region 10 can be laterally bounded by a set of parallel edges such that the first horizontal grating region 50 contacts a first edge among the set of parallel edges, and the first vertical grating region 60 contacts a second edge among the set of parallel edges. The width of the first horizontal grating region 50 (along the lengthwise direction of the horizontal gratings within the first horizontal grating region 50) may be the same as, or may be different from, the width of the first vertical grating region 60 (along the direction perpendicular to the direction of the vertical gratings within the first vertical grating region 60). In one embodiment, the first horizontal grating region 50 and the first vertical grating region 60 can have substantially the same width.

Each second focus monitor unit 120 can include a second lithographic feature region 20 having a same transmission coefficient throughout for electromagnetic radiation at a wavelength, which can be the wavelength of an electromagnetic radiation of the illumination beam of an exposure tool in which the reticle 102 is to be subsequently employed. The transmission coefficient of the second lithographic feature region 20 can be substantially equal to 1. Thus, the second lithographic feature region 20 can include a second transparent region of the reticle 102. A second horizontal grating region 50' is located on one side of the second lithographic feature region 20. A second vertical grating region 60' is located on the opposite side of the second lithographic feature region 20.

In one embodiment, the reticle 102 can include a patterned opaque layer located on a planar surface of a transparent substrate. In this case, the second horizontal grating region 50' and the second vertical grating region 60' can include portions of the patterned opaque layer. Specifically, a second horizontal grating within the second horizontal grating region 50' can be an array of horizontal lines of the patterned opaque layer, and a second vertical grating within the second vertical grating region 60' can be an array of vertical lines of the patterned opaque layer. The second lithographic feature region 20 can be a region in which portions of the patterned opaque layer are not present, thereby providing the maximum transparency that the reticle 102 can provide.

The horizontal grating of the second horizontal grating region 50' is a subresolution grating. By choosing the pitch <0.5λ/NA, the second horizontal grating region 50' is guaranteed not to resolve as a printed grating. Here λ is the exposure wavelength used by the exposure tool and NA is the Numerical Aperture of the exposure tool optics. The duty cycle of the grating is defined to be the ratio of the absorber width to the grating pitch. By choosing the width of the line for the second horizontal grating region 50', and hence the duty cycle of the horizontal grating, one is able to control the grey scale level. The duty cycle for the second horizontal grating region 50' typically ranges between 20% and 75%. EMF effects will cause the grey scale image to act like a weak phase shifter.

The vertical grating of the second vertical grating region 60' is a subresolution grating. As in the case of the second horizontal grating region 50', by choosing the pitch <0.5λ/NA, the second vertical grating region 60' is guaranteed not to resolve as a printed grating. By choosing the width of the line for the second vertical grating region 60', and hence the duty cycle of the vertical grating, one is able to control the grey scale level. The duty cycle for the second vertical grating region 60' typically ranges between 20% and 75%. EMF effects will cause the grey scale image to act like a weak phase shifter.

In one embodiment, the second lithographic feature region 20 can be laterally bounded by a set of parallel edges such that the second horizontal grating region 50' contacts a first edge among the set of parallel edges, and the second vertical grating region 60' contacts a second edge among the set of parallel edges. The width of the second horizontal grating region 50' (along the lengthwise direction of the horizontal gratings within the second horizontal grating region 50') may be the same as, or may be different from, the width of the second vertical grating region 60' (along the direction perpendicular to the direction of the vertical gratings within the second vertical grating region 60'). In one embodiment, the second horizontal grating region 50' and the second vertical grating region 60' can have substantially the same width.

In one embodiment, the relative location of the first horizontal grating region 50 with respect to the first lithographic feature region 10 can be in the opposite direction of the relative location of the second horizontal grating region 50' with respect to the second lithographic feature region 20.

In one embodiment, the first focus monitor unit 110 and the second focus monitor unit 120 can be mirror images of each other. In one embodiment, a plurality of first focus monitor units 110 and a plurality of second focus monitor units 120 can be within a one-dimensional periodic array having a periodicity along the lengthwise direction of horizontal gratings in the first and second horizontal grating regions (50, 50').

Each of the first and second horizontal grating regions (50, 50') can include a horizontal grating having a first pitch that is less than the minimum resolvable pitch of a system employed to lithographically expose a photoresist layer, i.e. pitch <0.5λ/NA. The system includes a lithographic exposure tool and the reticle 102. As used herein, a minimum lithographic pitch for a lithographic exposure tool is the minimum pitch that the lithographic exposure tool can print on a photoresist layer. Likewise, each of the first and second vertical grating regions (60, 60') can include a vertical grating having a second pitch that is less than the minimum lithographic pitch of a system employed to lithographically expose a photoresist layer.

In one embodiment, the focus monitor can further include at least one first opaque region 30 and at least one second opaque region 40. Each of the at least one first opaque region 30 can be located between a pair of a first horizontal grating region 50 and a second horizontal grating region 50' Each of the at least one second opaque region 40 can be located between a pair of a first vertical grating region 60 and a second vertical grating region 60'. In one embodiment, each first opaque region 30 can laterally contact a first horizontal grating region 50 and a second horizontal grating region 50', and each second opaque region 40 can laterally contact a first vertical grating region 60 and a second vertical grating region 60'.

In one embodiment, each of the first and second lithographic feature regions (10, 20) can have the same lateral width, i.e., a lateral distance between a pair of parallel edges that includes a proximal edge of a horizontal grating region (50 or 50') that adjoins the lithographic feature region (10 or 20) and a proximal edge of a vertical grating region (60 or 60') that adjoins the lithographic feature region (10 or 20). As used herein, a "proximal" edge refers to an edge that adjoins a neighboring lithographic feature region. In this case, the lateral width of each of the first and second lithographic feature regions (10, 20) is referred to as a first width.

Additionally or alternately, each first opaque region 30 and each second opaque region 40 can have the same lateral width. In this case, the lateral width of each of the first and second opaque regions (30, 40) is referred to as a second width, which can be the same as, or different from, the first width.

In one embodiment, the focus monitor structure on the reticle 102 can include a sequence, from one side to another, of a first instance of a first focus monitor unit 110, an instance of a second opaque region 40, an instance of a second focus monitor unit 120, an instance of a first opaque region 30, and a second instance of the first focus monitor unit 110. The lateral distance between the geometrical center of the first instance of the first focus monitor unit 110 and the geometrical center of the instance of the second focus monitor unit 120 is herein referred to as a first mask distance M1, and the lateral distance between the geometrical center of the instance of the second focus monitor unit 120 and the geometrical center of the second instance of the first focus monitor unit 110 is herein referred to as a second mask distance M2. The first mask distance M1 and the second mask distance M2 may, or may not, be the same. In one embodiment, the first mask distance M1 can be the same as the second mask distance M2.

In addition to the at least one focus monitor structure, the reticle 102 can further include any additional structures that can be employed to form additional patterns on a photoresist layer. For example, the reticle 102 can include lithographic patterns for forming semiconductor devices at any lithographic level known in the art. In this case, the reticle 102 is referred to as a product reticle, i.e., a reticle that can be employed to manufacture commercial semiconductor chips in a semiconductor device fabrication facility. In this case, lithographic patterns for semiconductor devices and at least one lithographic pattern including an image of the at least one focus monitor structure can be formed within a same photoresist layer on a substrate, which can be a semiconductor substrate as known in the art.

Figure 2:
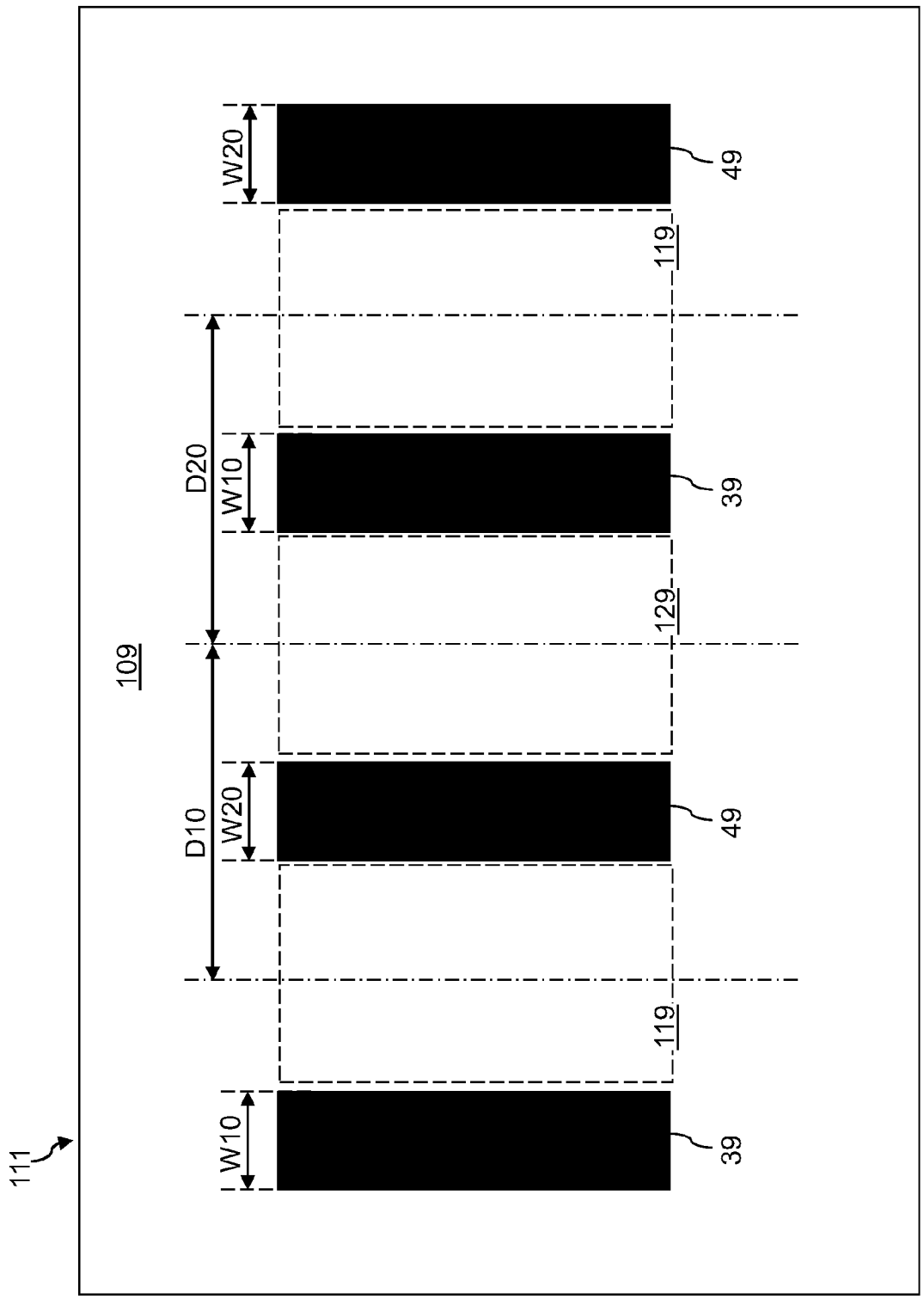
FIG. 2 is a top-down view of a portion of a patterned photoresist layer that has been lithographically exposed employing the first exemplary focus monitor structure at an optimal focus and subsequently developed according to an embodiment of the present disclosure.

Referring to FIG. 2, a patterned lithographic image in a photoresist layer can be generated by applying an unpatterned photoresist layer on a substrate 111, by lithographically exposing the photoresist layer employing a reticle 102 including a focus monitor structure such as the focus monitor structure in FIGS. 1A and 1B, and by developing the lithographically exposed photoresist layer. The vertical distance between the photoresist layer and the lens of the exposure tool employed to lithographically exposed the photoresist layer can be maintained at an optimal distance (which is the optimal focus) to generate the patterned lithographic image illustrated in FIG. 2.

In one embodiment, the illumination beam employed to lithographically expose the photoresist layer can be polarized along the lengthwise direction of the vertical gratings in the vertical grating regions (60, 60') of the reticle 102. In another embodiment, the illumination beam employed to lithographically expose the photoresist layer can be polarized along the lengthwise direction of the vertical gratings in the horizontal grating regions (50, 50') of the reticle 102. As used herein, the direction of polarization refers to the direction of the electrical field of an electromagnetic radiation, which is perpendicular to the direction of the magnetic field of the electromagnetic radiation and to the direction of propagation of the electromagnetic radiation. For example, if the illumination beam is polarized along the lengthwise direction of the vertical gratings in the vertical grating regions (60, 60') of the reticle 102, the electric field of the illumination beam is predominantly along the lengthwise direction of the vertical gratings in the vertical grating regions (60, 60') of the reticle 102.

The patterned photoresist layer can include at least one primary region 109 and at least one complementary region. The at least one primary region 109 (the white region of the substrate 111 in FIG. 2) and the at least one complementary region (the black regions of the substrate 111 in FIG. 2) are complements of each other. In one embodiment, the at least one complementary region can include at least one first opaque image region 39 that reproduces the pattern of the at least one first opaque region 30 and at least one second opaque image region 49 that reproduces the pattern of the at least one second opaque region 40. The area of the at least one primary region 109 and the area of the at least one complementary region (39, 49) are mutually exclusive of each other, and collectively encompass the entirety of the area in which the unpatterned photoresist layer is initially present prior to development. If the reticle 102 includes patterns for devices, i.e., product patterns, the at least one primary region 109 and the at least one complementary region (39, 49) can include additional regions that reproduce the product patterns. Thus, while the reference numeral 109 is associated with the at least one primary region 109, and the reference numerals (39, 49) are associated with the at least one complementary region (39, 49), it is understood that the at least one primary region may include first additional regions (not shown) and the at least one complementary region may include second additional regions (not shown) if the reticle includes product patterns.

In one embodiment, all portions of the at least one primary region 109 can be devoid of any photoresist material after development, and developed portions of the photoresist layer can be present in each of the at least one complementary region (39, 49). In this case, the area of the developed photoresist layer can coincide with the area of the at least one complementary region (39, 49), and the area from which the photoresist material of the developed photoresist layer is removed can coincide with the area of the at least one primary region 109. This situation is commonly referred to as a positive tone resist process, where dark areas of mask become resist patterns.

In another embodiment, all portions of the at least one complementary region (39, 49) can be devoid of any photoresist material after development, and developed portions of the photoresist layer can be present in each of the at least one primary region 109. In this case, the area of the developed photoresist layer can coincide with the area of the at least one primary region 109, and the area from which the photoresist material of the developed photoresist layer is removed can coincide with the area of the at least one complementary region (39, 49). This situation is commonly referred to as a negative tone resist process, where bright areas of mask become resist patterns. An increasingly popular way to achieve a negative tone resist process is to use a standard positive tone resist material in a Negative Tone Development process, typically involving solvent developer.

The patterned photoresist layer includes an image of the at least one focus monitor structure. The printed image of the at least one focus monitor structure includes a first printed image component, which is a printed image of a first focus monitor unit 110. Because the first horizontal grating region 50 and the first vertical grating region 60 within each first focus monitor unit 110 do not generate a direct image, the first printed image component include a first transparent image region 119 that extends between a first opaque image region 39 (which is an image of a first opaque region 30) and a second opaque image region 49 (which is an image of a second opaque region 40). In this case, the first printed image component can consist of the first transparent image region 119.

Further, the printed image of the at least one focus monitor structure includes a second printed image component, which is a printed image of a second focus monitor unit 120. Because the second horizontal grating region 50' and the second vertical grating region 60' within each second focus monitor unit 120 do not generate a direct image, the second printed image component include a second transparent image region 129 that extends between another first opaque image region 39 (which is an image of another first opaque region 30) and a second opaque image region 49 (which is an image of a second opaque region 40). In this case, the second printed image component can consist of the second transparent image region 129.

In one embodiment, each first transparent image region 119 can be laterally bounded by a set of parallel edges, which includes an edge of a first opaque image region 39 and an edge of a second opaque image region 49. Likewise, each second transparent image region 129 can be laterally bounded by a set of parallel edges, which includes an edge of a first opaque image region 39 and an edge of a second opaque image region 49.

Each first opaque image region 39 can have a lateral width in the direction of at least one repetition of the first transparent image region(s) 119 and the second transparent image region(s) 129. The lateral width of a first opaque image region 39 is herein referred to as a first opaque region nominal width W10. Likewise, each second opaque image region 49 can have a lateral width in the direction of at least one repetition of the first transparent image region(s) 119 and the second transparent image region(s) 129. The lateral width of a second opaque image region 49 is herein referred to as a second opaque region nominal width W20.

Under the condition of the optimal focus, the electromagnetic field effects of the polarized illumination beam due to a horizontal grating region (50 or 50') and a vertical grating region (60 or 60') within each focus monitor unit (110 or 120) does not cause any lateral shifting of the image of the focus monitor unit (110 or 120). Thus, the location of the center of each first transparent image region 119 under the condition of optimal focus is identical to the location of a corresponding image that would be obtained from a hypothetical reticle in which all of the horizontal grating regions (50, 50') and the vertical grating regions (60, 60') are removed, i.e., replaced with transparent regions. Likewise, the location of the center of each second transparent image region 129 under the condition of the optimal focus is identical to the location of a corresponding image that would be obtained from a hypothetical reticle in which all of the horizontal grating regions (50, 50') and the vertical grating regions (60, 60') are removed.

Further, the location of the center of each first opaque image region 39 under the condition of optimal focus is identical to the location of a corresponding image that would be obtained from a hypothetical reticle in which all of the horizontal grating regions (50, 50') and the vertical grating regions (60, 60') are removed. Likewise, the location of the center of each second opaque image region 49 under the condition of the optimal focus is identical to the location of a corresponding image that would be obtained from a hypothetical reticle in which all of the horizontal grating regions (50, 50') and the vertical grating regions (60, 60') are removed.

In one embodiment, the pattern on the reticle substrate 100 can include a sequence, from one side to another, of a first instance of a first focus monitor unit 110, an instance of a second opaque region 40, an instance of a second focus monitor unit 120, an instance of a first opaque region 30, and a second instance of the first focus monitor unit 110. In this case, the patterned photoresist layer on the substrate 111 can include a sequence, from one side to another, of a first instance of a first transparent image region 119, an instance of a second opaque image region 49, an instance of a second transparent image region 129, an instance of a first opaque image region 39, and a second instance of the first transparent image region 119.

The lateral distance between the geometrical center of the first instance of the first transparent image region 119 and the geometrical center of the instance of the second transparent image region 129 is herein referred to as a first printed image nominal distance D10, and the lateral distance between the geometrical center of the instance of the second transparent image region 129 and the geometrical center of the second instance of the first transparent image region 119 is herein referred to as a second printed image nominal distance D20. Under the condition of optimal focus, the ratio of the first mask distance M1 to the second mask distance M2 is the same as the ratio of the first printed image nominal distance D10 to the second printed image nominal distance D20. If the first mask distance M1 is the same as the second mask distance M2, the first printed image nominal distance D10 is the same as the second printed image nominal distance D20.

Figure 3:
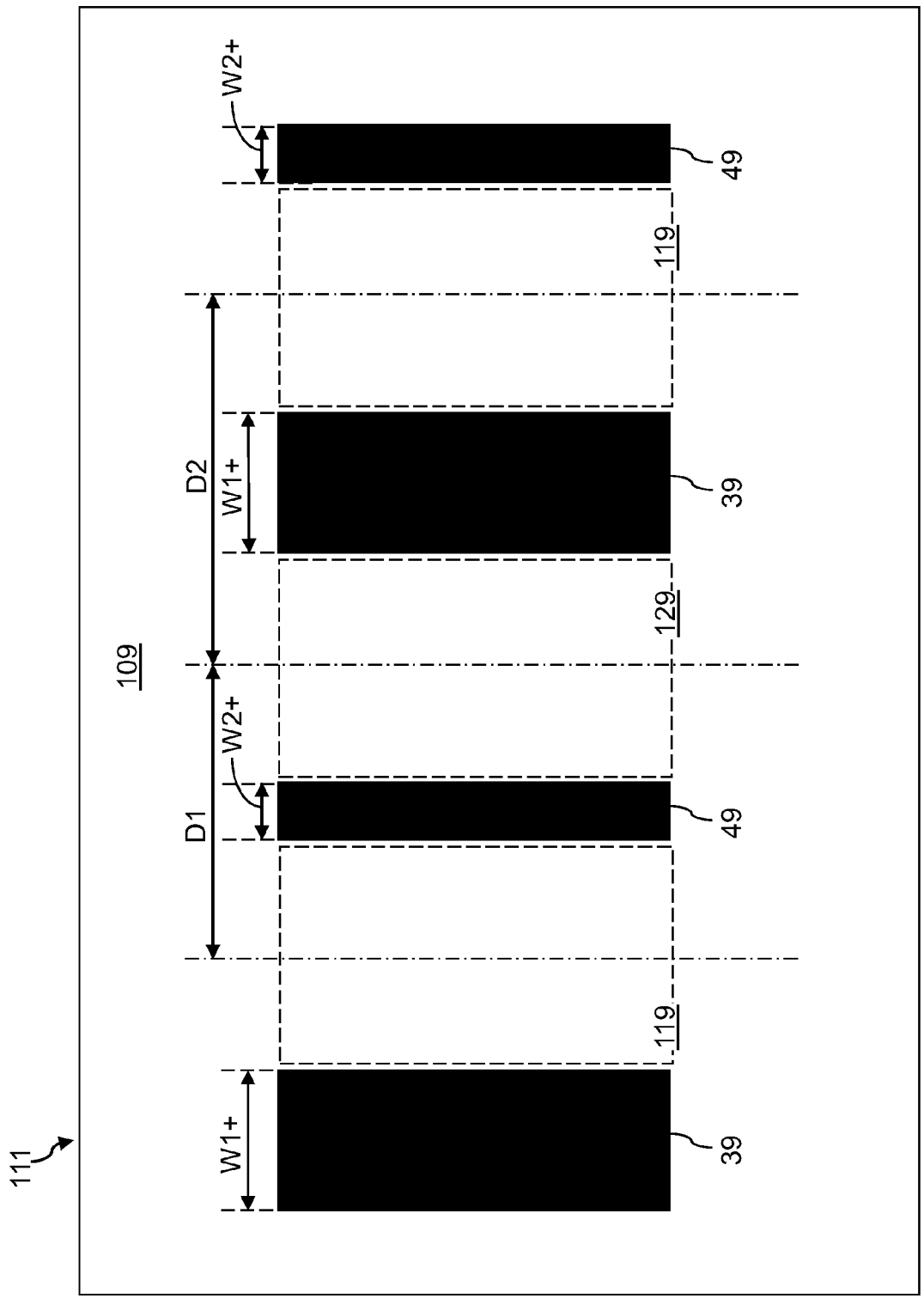
FIG. 3 is a top-down view of a portion of a patterned photoresist layer that has been lithographically exposed employing the first exemplary focus monitor structure with a first non-zero focus offset and subsequently developed according to an embodiment of the present disclosure.

Referring to FIG. 3, a patterned lithographic image in a photoresist layer can be generated by applying an unpatterned photoresist layer on a substrate 111, by lithographically exposing the photoresist layer employing a reticle 102 including a focus monitor structure at a setting in which the vertical distance between the photoresist layer and the lens of the exposure tool employed to lithographically exposed the photoresist layer is maintained at a non-optimal distance, and by developing the lithographically exposed photoresist layer. As used herein, a focus offset is defined as the vertical distance between the photoresist layer and the lens of the exposure tool employed to lithographically expose the photoresist layer at the optimal focus less the vertical distance between the photoresist layer and the lens of the exposure tool employed to lithographically exposed the photoresist layer at the time of lithographic exposure of the photoresist layer. Thus, a positive focus offset corresponds to a condition in which the vertical distance between the photoresist layer and the lens of the exposure tool employed to lithographically exposed the photoresist layer is less than the optimal focus, and a negative offset corresponds to a condition in which the vertical distance between the photoresist layer and the lens of the exposure tool employed to lithographically exposed the photoresist layer is greater than the optimal focus.

In one embodiment, the image of the patterned photoresist layer as illustrated in FIG. 3 can be obtained by employing a polarized illumination beam that is polarized along the lengthwise direction of the vertical gratings in the vertical grating regions (60, 60') of the reticle 102, and by setting the non-zero focus offset (which is herein referred to as a first non-zero offset) as a positive offset, i.e., by reducing the vertical distance between the photoresist layer and the lens of the exposure tool employed to lithographically expose the photoresist layer.

In another embodiment, the image of the patterned photoresist layer as illustrated in FIG. 3 can be obtained by employing a polarized illumination beam that is polarized along the lengthwise direction of the horizontal gratings in the horizontal grating regions (50, 50') of the reticle 102, and by setting the non-zero focus offset (which is herein referred to as a first non-zero offset) as a negative offset, i.e., by increasing the vertical distance between the photoresist layer and the lens of the exposure tool employed to lithographically expose the photoresist layer.

Under any of the two combinations of the polarization of the illumination beam and the polarity of the focus offset described above, each first printed image component, which is a printed image of a first focus monitor unit 110, shifts toward a neighboring second opaque image region 49 due to the electromagnetic field effects of the sub-resolution features present within the first horizontal grating region 50 and the first vertical grating region 60 within the first focus monitor unit 110. The electromagnetic field effect upon the polarized illumination beam is the net effect of interferences of various rays of the polarized illumination beam through the first horizontal grating region 50, the first vertical grating region 60, and the first lithographic feature region 10. The first horizontal grating region 50 and the first vertical grating region 60 effectively function as weak phase shifters that laterally shift the image of the first focus monitor unit 110 along the direction of the relative direction of the first vertical grating region 60 relative to the first lithographic feature region 10, which is the same as the relative direction of the neighboring second opaque image region 49 relative to the first transparent image region 119 in the developed photoresist layer.

Likewise, under any of the two combinations of the polarization of the illumination beam and the polarity of the focus offset described above, each second printed image component, which is a printed image of a second focus monitor unit 120, shifts toward a neighboring second opaque image region 49 due to the electromagnetic field effects of the sub-resolution features present within the second horizontal grating region 50' and the second vertical grating region 60' within the second focus monitor unit 110'. The electromagnetic field effect upon the polarized illumination beam is the net effect of interferences of various rays of the polarized illumination beam through the second horizontal grating region 50', the second vertical grating region 60', and the second lithographic feature region 20. The second horizontal grating region 50' and the second vertical grating region 60' effectively function as weak phase shifters that laterally shift the image of the second focus monitor unit 120 along the direction of the relative direction of the second vertical grating region 60' relative to the second lithographic feature region 20, which is the same as the relative direction of the neighboring second opaque image region 49 relative to the second transparent image region 119 in the developed photoresist layer.

The electromagnetic field effects of the sub-resolution features present within the various horizontal grating regions (50, 50') and the vertical grating regions (60, 60') causes each first opaque image region 39 to have a lateral width that is greater than the first opaque region nominal width W10. The lateral width of the first opaque image regions 39 in this case is herein referred to as a first opaque region first-non-nominal width W1+. Further, the electromagnetic field effects of the sub-resolution features present within the various horizontal grating regions (50, 50') and the vertical grating regions (60, 60') causes each second opaque image region 39 to have a lateral width that is less than the second opaque region nominal width W20. The lateral width of the second opaque image regions 49 in this case is herein referred to as a second opaque region first-non-nominal width W2+.

The electromagnetic field effects of the polarized illumination beam due to a horizontal grating region (50 or 50') and a vertical grating region (60 or 60') within each focus monitor unit (110 or 120) causes any lateral shifting of the image of the focus monitor unit (110 or 120). Thus, the location of the center of each first transparent image region 119 under the condition of a non-optimal focus is different from the location of a corresponding image that would be obtained from a hypothetical reticle in which all of the horizontal grating regions (50, 50') and the vertical grating regions (60, 60') are removed, i.e., replaced with transparent regions. Likewise, the location of the center of each second transparent image region 129 under the condition of the non-optimal focus is different from the location of a corresponding image that would be obtained from a hypothetical reticle in which all of the horizontal grating regions (50, 50') and the vertical grating regions (60, 60') are removed.

If each first focus monitor unit 110 is a mirror image of any of the second focus monitor unit, the location of the center of each first opaque image region 39 and the location of the center of each second opaque image region 49 do not shift under the condition of a non-optimal focus relative to the condition of the optimal focus. Thus, the location of the center of each first opaque image region 39 and the location of the center of each second opaque image region 49 can function as invariant points that do not change with variations in the focus offset in a lithographic exposure tool.

In one embodiment, the pattern on the reticle substrate 102 can include a sequence, from one side to another, of a first instance of a first focus monitor unit 110, an instance of a second opaque region 40, an instance of a second focus monitor unit 120, an instance of a first opaque region 30, and a second instance of the first focus monitor unit 110. In this case, the patterned photoresist layer on the substrate 111 can include a sequence, from one side to another, of a first instance of a first transparent image region 119, an instance of a second opaque image region 49, an instance of a second transparent image region 129, an instance of a first opaque image region 39, and a second instance of the first transparent image region 119.

The lateral distance between the geometrical center of the first instance of the first transparent image region 119 and the geometrical center of the instance of the second transparent image region 129 is herein referred to as a first printed image distance D1, which is less than the first printed image nominal distance D10. The lateral distance between the geometrical center of the instance of the second transparent image region 129 and the geometrical center of the second instance of the first transparent image region 119 is herein referred to as a second printed image distance D2, which is greater than the second printed image nominal distance D20. Under the condition of a non-optimal focus in which the polarization of the illumination beam is along the vertical direction and the focus offset is positive or under the condition of a non-optimal focus in which the polarization of the illumination beam is along the horizontal direction and the focus offset is negative, the ratio of the first printed image distance D1 to the second printed image distance D2 is less than the ratio of the first mask distance M1 to the second mask distance M2. If the first mask distance M1 is the same as the second mask distance M2, the ratio of the first printed image distance D1 to the second printed image distance D2 is less than 1.0. The degree of deviation in the ratio of the first printed image distance D1 to the second printed image distance D2 from the ratio of the first mask distance M1 to the second mask distance M2 is proportional to the magnitude of the focus offset to first order.

Figure 4:
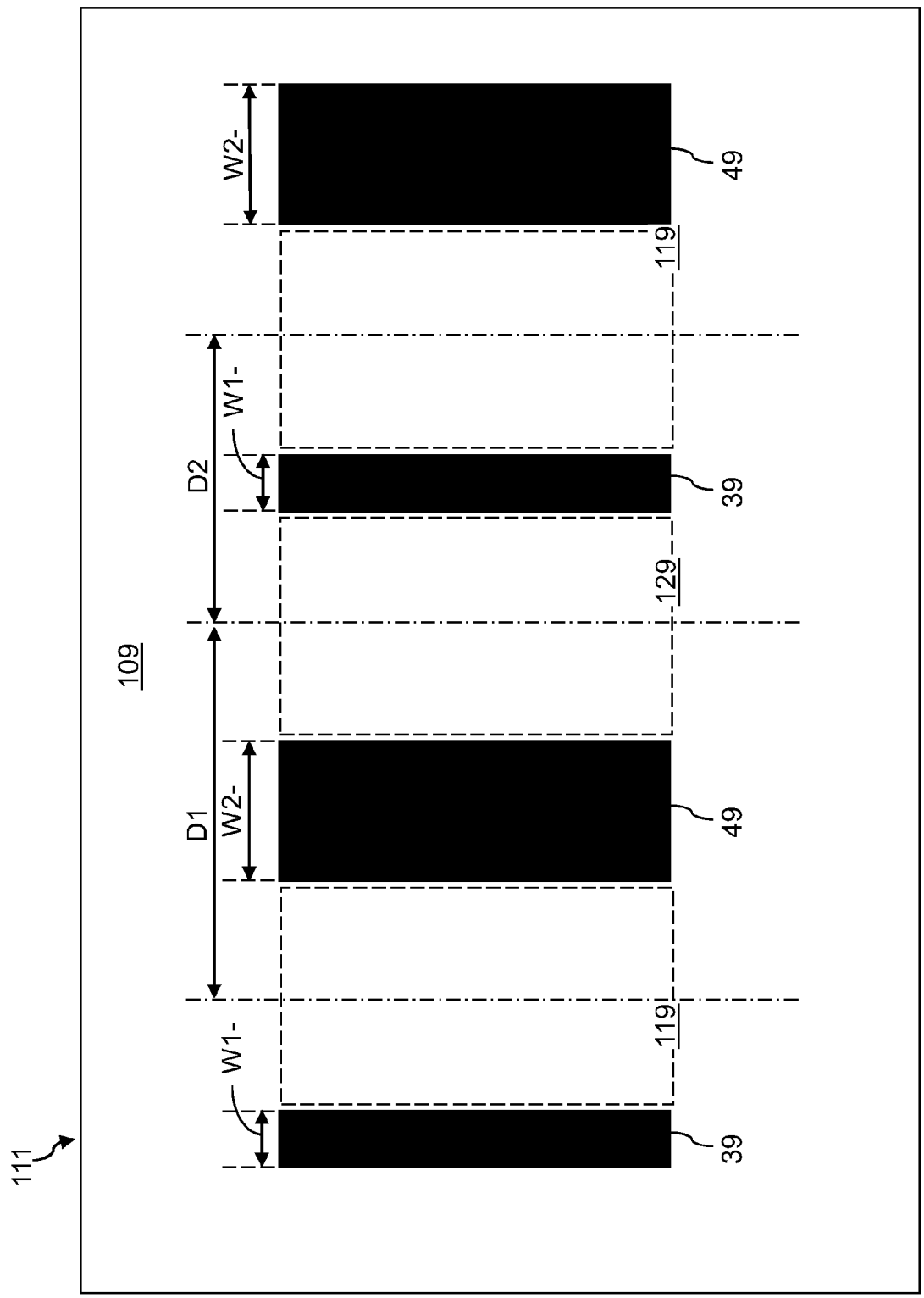
FIG. 4 is a top-down view of a portion of a patterned photoresist layer that has been lithographically exposed employing the first exemplary focus monitor structure with a second non-zero focus offset and subsequently developed according to an embodiment of the present disclosure.

Referring to FIG. 4, a patterned lithographic image in a photoresist layer can be generated by applying an unpatterned photoresist layer on a substrate 111, by lithographically exposing the photoresist layer employing a reticle 102 including a focus monitor structure at a setting in which the vertical distance between the photoresist layer and the lens of the exposure tool employed to lithographically exposed the photoresist layer is maintained at a non-optimal distance, and by developing the lithographically exposed photoresist layer.

In one embodiment, the image of the patterned photoresist layer as illustrated in FIG. 4 can be obtained by employing a polarized illumination beam that is polarized along the lengthwise direction of the horizontal gratings in the horizontal grating regions (50, 50') of the reticle 102, and by setting the non-zero focus offset (which is herein referred to as a first non-zero offset) as a positive offset, i.e., by reducing the vertical distance between the photoresist layer and the lens of the exposure tool employed to lithographically expose the photoresist layer.

In another embodiment, the image of the patterned photoresist layer as illustrated in FIG. 4 can be obtained by employing a polarized illumination beam that is polarized along the lengthwise direction of the vertical gratings in the vertical grating regions (60, 60') of the reticle 102, and by setting the non-zero focus offset (which is herein referred to as a first non-zero offset) as a negative offset, i.e., by increasing the vertical distance between the photoresist layer and the lens of the exposure tool employed to lithographically expose the photoresist layer.

Under any of the two combinations of the polarization of the illumination beam and the polarity of the focus offset for generating the pattern in FIG. 4, each first printed image component, which is a printed image of a first focus monitor unit 110, shifts away from a neighboring second opaque image region 49 due to the electromagnetic field effects of the sub-resolution features present within the first horizontal grating region 50 and the first vertical grating region 60 within the first focus monitor unit 110. The electromagnetic field effect upon the polarized illumination beam is the net effect of interferences of various rays of the polarized illumination beam through the first horizontal grating region 50, the first vertical grating region 60, and the first lithographic feature region 10. The first horizontal grating region 50 and the first vertical grating region 60 effectively function as weak phase shifters that laterally shift the image of the first focus monitor unit 110 along the direction of the relative direction of the first horizontal grating region 50 relative to the first lithographic feature region 10, which is the same as the relative direction of the neighboring first opaque image region 39 relative to the first transparent image region 119 in the developed photoresist layer.

Likewise, under any of the two combinations of the polarization of the illumination beam and the polarity of the focus offset for generating the pattern in FIG. 4, each second printed image component, which is a printed image of a second focus monitor unit 120, shifts away from a neighboring second opaque image region 49 due to the electromagnetic field effects of the sub-resolution features present within the second horizontal grating region 50' and the second vertical grating region 60' within the second focus monitor unit 110'. The electromagnetic field effect upon the polarized illumination beam is the net effect of interferences of various rays of the polarized illumination beam through the second horizontal grating region 50', the second vertical grating region 60', and the second lithographic feature region 20. The second horizontal grating region 50' and the second vertical grating region 60' effectively function as weak phase shifters that laterally shift the image of the second focus monitor unit 120 along the direction of the relative direction of the second horizontal grating region 60' relative to the second lithographic feature region 20, which is the same as the relative direction of the neighboring first opaque image region 39 relative to the second transparent image region 119 in the developed photoresist layer.

The electromagnetic field effects of the sub-resolution features present within the various horizontal grating regions (50, 50') and the vertical grating regions (60, 60') causes each first opaque image region 39 to have a lateral width that is less than the first opaque region nominal width W10. The lateral width of the first opaque image regions 39 in this case is herein referred to as a first opaque region second-non-nominal width W1−. Further, the electromagnetic field effects of the sub-resolution features present within the various horizontal grating regions (50, 50') and the vertical grating regions (60, 60') causes each second opaque image region 39 to have a lateral width that is greater than the second opaque region nominal width W20. The lateral width of the second opaque image regions 49 in this case is herein referred to as a second opaque region second-non-nominal width W2−.

The electromagnetic field effects of the polarized illumination beam due to a horizontal grating region (50 or 50') and a vertical grating region (60 or 60') within each focus monitor unit (110 or 120) causes any lateral shifting of the image of the focus monitor unit (110 or 120). Thus, the location of the center of each first transparent image region 119 under the condition of a non-optimal focus is different from the location of a corresponding image that would be obtained from a hypothetical reticle in which all of the horizontal grating regions (50, 50') and the vertical grating regions (60, 60') are removed, i.e., replaced with transparent regions. Likewise, the location of the center of each second transparent image region 129 under the condition of the non-optimal focus is different from the location of a corresponding image that would be obtained from a hypothetical reticle in which all of the horizontal grating regions (50, 50') and the vertical grating regions (60, 60') are removed.

If each first focus monitor unit 110 is a mirror image of any of the second focus monitor unit, the location of the center of each first opaque image region 39 and the location of the center of each second opaque image region 49 do not shift under the condition of a non-optimal focus relative to the condition of the optimal focus. Thus, the location of the center of each first opaque image region 39 and the location of the center of each second opaque image region 49 can function as invariant points that do not change with variations in the focus offset in a lithographic exposure tool.

In one embodiment, the pattern on the reticle substrate 102 can include a sequence, from one side to another, of a first instance of a first focus monitor unit 110, an instance of a second opaque region 40, an instance of a second focus monitor unit 120, an instance of a first opaque region 30, and a second instance of the first focus monitor unit 110. In this case, the patterned photoresist layer on the substrate 111 can include a sequence, from one side to another, of a first instance of a first transparent image region 119, an instance of a second opaque image region 49, an instance of a second transparent image region 129, an instance of a first opaque image region 39, and a second instance of the first transparent image region 119.

The lateral distance between the geometrical center of the first instance of the first transparent image region 119 and the geometrical center of the instance of the second transparent image region 129 is herein referred to as a first printed image second-non-nominal distance D1', which is greater than the first printed image nominal distance D10. The lateral distance between the geometrical center of the instance of the second transparent image region 129 and the geometrical center of the second instance of the first transparent image region 119 is herein referred to as a second printed image second-non-nominal distance D2−, which is less than the second printed image nominal distance D20. Under the condition of a non-optimal focus in which the polarization of the illumination beam is along the horizontal direction and the focus offset is positive or under the condition of a non-optimal focus in which the polarization of the illumination beam is along the vertical direction and the focus offset is negative, the ratio of the first printed image second-non-nominal distance D1− to the second printed image second-non-nominal distance D2− is greater than the ratio of the first mask distance M1 to the second mask distance M2. If the first mask distance M1 is the same as the second mask distance M2, the ratio of the first printed image second-non-nominal distance D1− to the second printed image second-non-nominal distance D2− is greater than 1.0. The degree of deviation in the ratio of the first printed image second-non-nominal distance D1' to the second printed image second-non-nominal distance D2− from the ratio of the first mask distance M1 to the second mask distance M2 is proportional to the magnitude of the focus offset to first order.

Figure 5A:
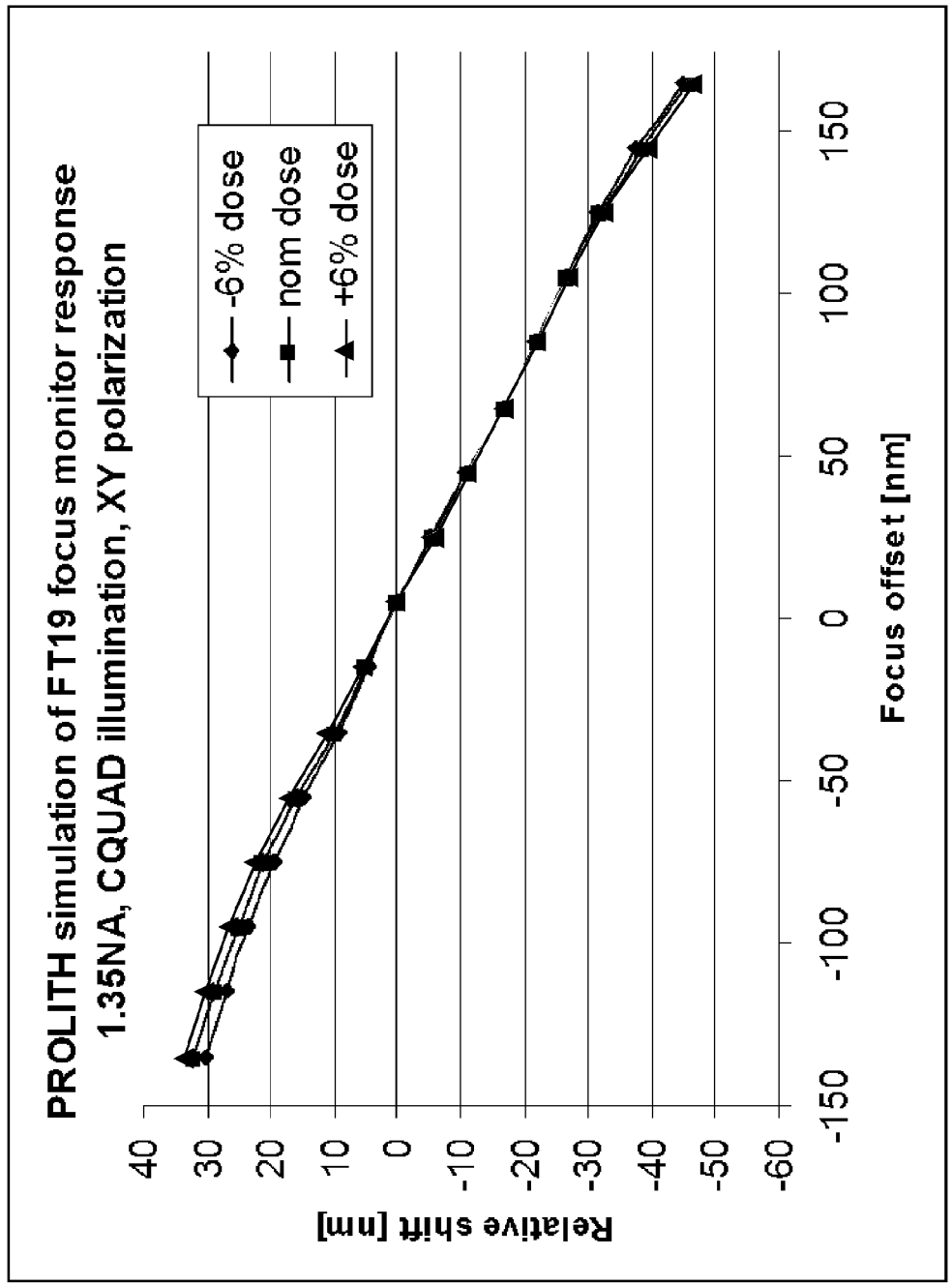
FIG. 5A is a graph illustrating the result of a simulation on the shift of a printed image as a function of a focus offset and exposure dose variation for the first exemplary focus monitor structure.

Referring to FIG. 5A, a graph illustrates the result of a simulation on the shift of a printed image as a function of a focus offset and exposure dose variation for the first exemplary focus monitor structure illustrated in FIGS. 1A and 1B. A 193 nm polarized illumination beam having an X-Y polarization was assumed. The relative shift on the vertical axis of FIG. 5A corresponds to the difference between the second printed image distance D2 and the first printed image distance D1, i.e., D2−D1, in FIGS. 4 and 5. The relative shift of the lateral distance between the geometrical centers of the first second transparent image region 119 and the geometrical center of the second transparent image region 129 as a function of the focus offset is linear to first order.

Figure 5B:
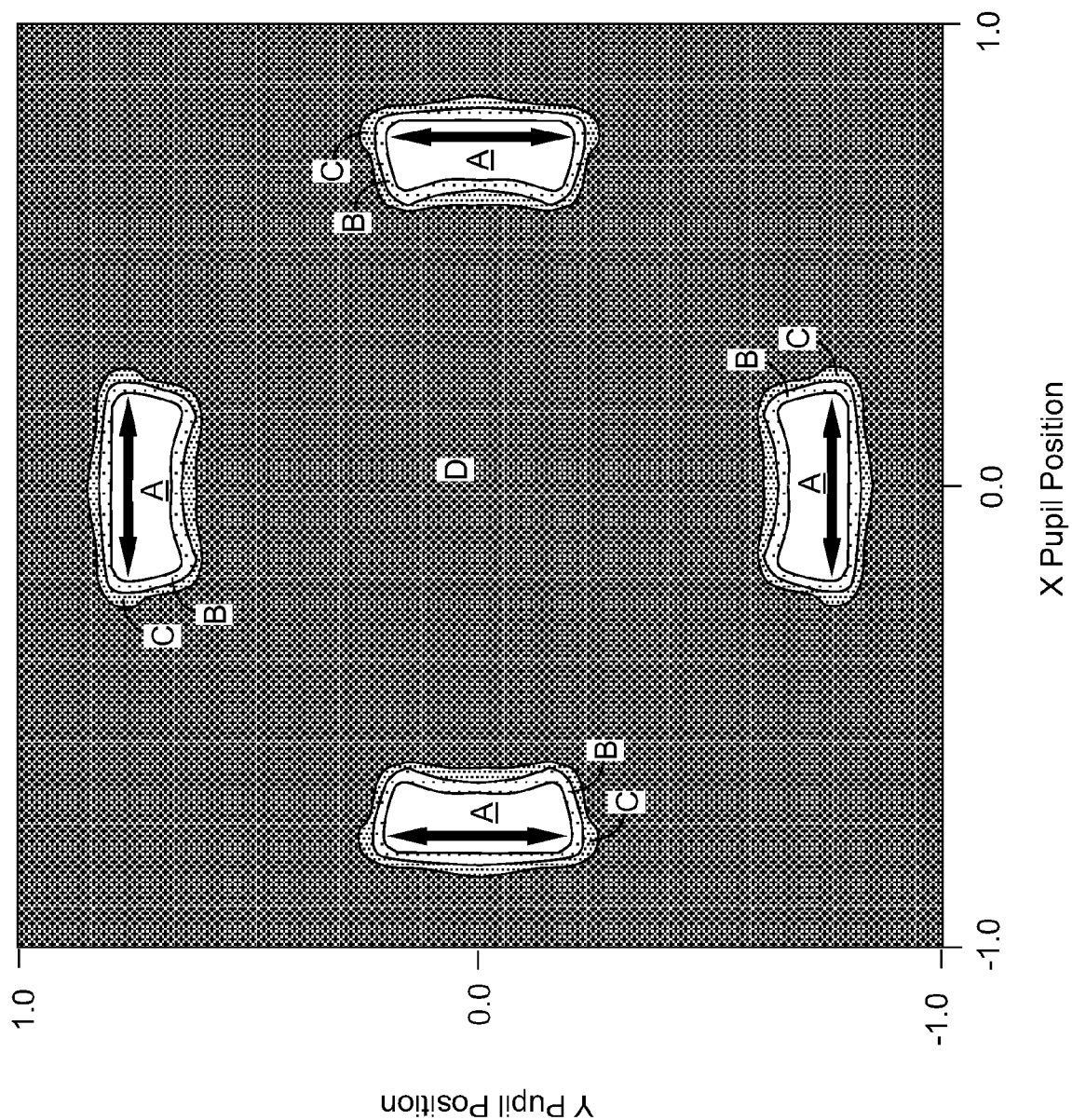
FIG. 5B is an intensity distribution of from a quasar illumination that can be employed for the methods of the present disclosure.

FIG. 5B illustrates the assumed QUASAR illumination, along with the direction of the E-field in the four quadrants. Areas labeled "A" corresponds to the areas in which the intensity of illumination radiation at a pupil plane is at maximum illumination intensity, i.e., 100% of the intensity that would be obtained without an illuminator that defines the QUASAR illumination pattern. Areas labeled "B" corresponds to the areas in which the intensity of illumination radiation at the pupil plane is between 66.7% of the maximum illumination intensity and 100% of the maximum illumination intensity. Areas labeled "C" corresponds to the areas in which the intensity of illumination radiation at the pupil plane is between 33.3% of the maximum illumination intensity and 66.7% of the maximum illumination intensity. Areas labeled "D" corresponds to the areas in which the intensity of illumination radiation at the pupil plane is zero. Numerical aperture of 1.35 was assumed for the simulation. The horizontal grating in each horizontal grating region (50, 50') was assumed to have a pitch of 48 nm with 73 repetitions. The vertical grating in each vertical grating region (60, 60') was assumed to have a pitch of 48 nm with 3 repetitions. The width of each first lithographic feature region 10 was 96 nm, and the width of each second lithographic feature region 20 was 96 nm. Within a neighboring pair of a first transparent image region 119 and a second transparent image region 129, the relative shift of the lateral distance between the geometrical centers of the first second transparent image region 119 and the geometrical center of the second transparent image region 129 at various focus offsets is plotted in the graph.

Figure 5C:
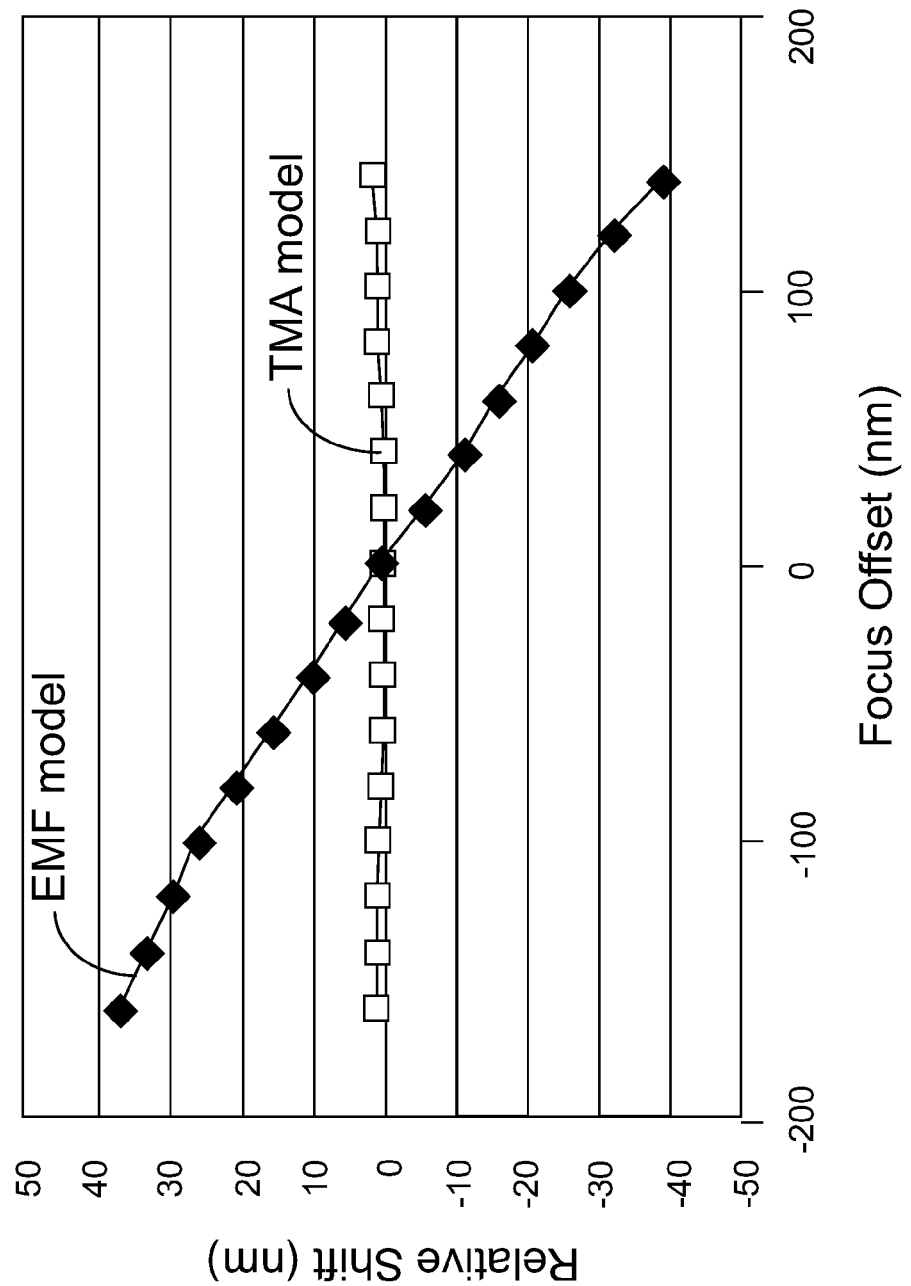
FIG. 5C illustrates the different results on simulation of a relative shift employing a thin mask approximation model and a full EMF model.

It is crucial to use a rigorous EMF mask model to properly model focus monitor behavior, such as shown in FIG. 5A. The much more commonly used "Thin Mask Approximation" (TMA) does not properly model these effects. FIG. 5C compares lithographic modeling using a full EMF model with the inadequate TMA model. The TMA model does not predict a relative shift with focus at all. The rigorous EMF results of FIGS. 5A and 5C were obtained using the PROLITH Rigorous Coupled-Wave Approximation (RCWA) model. The TMA model is unable to capture the fact that the sub-resolution gratings are acting like weak phase shifters.

Figure 6:
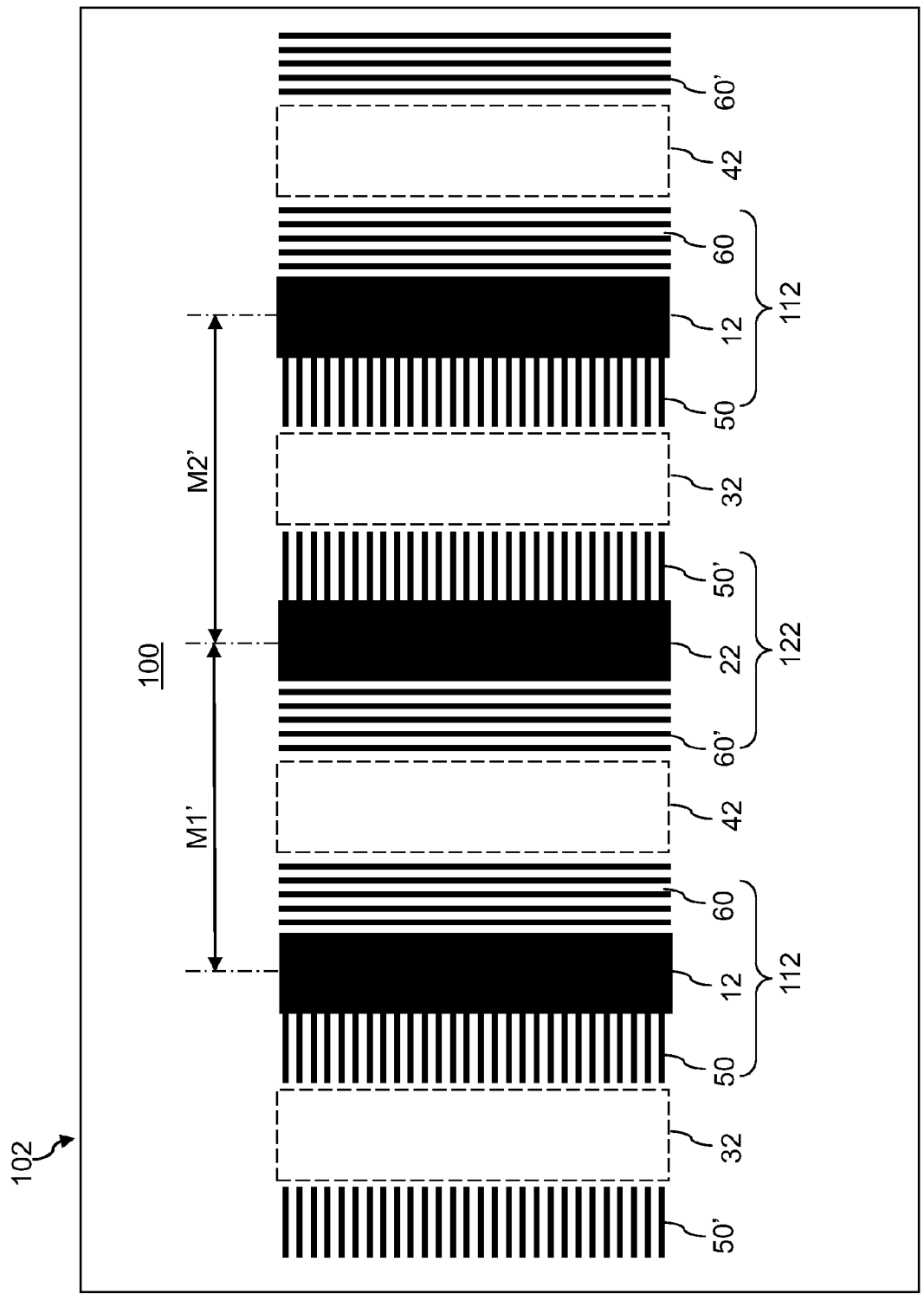
FIG. 6 is a top-down view of a portion of a second exemplary focus monitor structure on a reticle according to an embodiment of the present disclosure.

Referring to FIG. 6, a second exemplary focus monitor structure on a reticle 102 is shown according to an embodiment of the present disclosure. The reticle 102 can have any type of substrate as known in the art. In one embodiment, the reticle 102 includes a reticle substrate 100 which is a transparent substrate. The reticle 102 can be a chrome-on glass (COG) mask, an opaque MoSi on glass (OMOG) mask, a phase shift mask (PSM), or an attenuated phase shift mask (attenuated PSM) as known in the art. The reticle substrate 100 can have the same thickness throughout the entirety thereof, or can include a region having the same thickness. The reticle substrate 100 can be transparent throughout the entirety thereof.

The reticle 102 can include at least one focus monitor structure. Each focus monitor structure includes one or more focus monitor units. For example, the focus monitor structure illustrated in FIG. 6 can include at least one first focus monitor unit 112 and at least one second focus monitor unit 122.

Each first focus monitor unit 112 can include a first lithographic feature region 12 having a same transmission coefficient throughout for electromagnetic radiation at a wavelength, which can be the wavelength of an electromagnetic radiation of the illumination beam of an exposure tool in which the reticle 102 is to be subsequently employed. The transmission coefficient of the first lithographic feature region 12 can be substantially equal to 0. Thus, the first lithographic feature region 12 can include a first opaque region of the reticle 102. A first horizontal grating region 50 is located on one side of the first lithographic feature region 12. A first vertical grating region 60 is located on the opposite side of the first lithographic feature region 12.

In one embodiment, the reticle 102 can include a patterned opaque layer located on a planar surface of a transparent substrate. In this case, the first horizontal grating region 50 and the first vertical grating region 60 can include portions of the patterned opaque layer. Specifically, a first horizontal grating within the first horizontal grating region 50 can be an array of horizontal lines of the patterned opaque layer, and a first vertical grating within the first vertical grating region 60 can be an array of vertical lines of the patterned opaque layer. The first lithographic feature region 12 can be a region in which portions of the patterned opaque layer are present, thereby providing the minimum transparency that the reticle 102 can provide.

The horizontal grating of the first horizontal grating region 50 is a subresolution grating, i.e., a grating that does not produce a direct image on the photoresist. The width and pitch of each line components within the horizontal grating can be selected such that a direct image of the first horizontal grating region 50 is not physically present within a developed photoresist layer. In one embodiment, the percentage of the opaque areas within the first horizontal grating region 50 can be reduced, for example, below 50%, so that the amount of illumination passing through the first horizontal grating region 50 at zeroth order is sufficient to cause substantially the same chemical changes in the portion of the photoresist corresponding to the first horizontal grating region 50 as in the portion of the photoresist corresponding to the first lithographic feature region 12.

The vertical grating of the first vertical grating region 60 is a subresolution grating. The width and pitch of each line components within the vertical grating can be selected such that a direct image of the first vertical grating region 60 is not physically present within a developed photoresist layer. In one embodiment, the percentage of the opaque areas within the first vertical grating region 60 can be reduced, for example, below 50%, so that the amount of illumination passing through the first vertical grating region 60 at zeroth order is sufficient to cause substantially the same chemical changes in the portion of the photoresist corresponding to the first vertical grating region 60 as in the portion of the photoresist corresponding to the first lithographic feature region 12.

In one embodiment, the first lithographic feature region 12 can be laterally bounded by a set of parallel edges such that the first horizontal grating region 50 contacts a first edge among the set of parallel edges, and the first vertical grating region 60 contacts a second edge among the set of parallel edges. In one embodiment, the first lithographic feature region 12 can have a rectangular shape. The width of the first horizontal grating region 50 (along the lengthwise direction of the horizontal gratings within the first horizontal grating region 50) may be the same as, or may be different from, the width of the first vertical grating region 60 (along the direction perpendicular to the direction of the vertical gratings within the first vertical grating region 60). In one embodiment, the first horizontal grating region 50 and the first vertical grating region 60 can have substantially the same width.

Each second focus monitor unit 122 can include a second lithographic feature region 22 having a same transmission coefficient throughout for electromagnetic radiation at a wavelength, which can be the wavelength of an electromagnetic radiation of the illumination beam of an exposure tool in which the reticle 102 is to be subsequently employed. The transmission coefficient of the second lithographic feature region 22 can be substantially equal to 0. Thus, the second lithographic feature region 22 can include a second opaque region of the reticle 102. A second horizontal grating region 50' is located on one side of the second lithographic feature region 22. A second vertical grating region 60' is located on the opposite side of the second lithographic feature region 22.

In one embodiment, the reticle 102 can include a patterned opaque layer located on a planar surface of a transparent substrate. In this case, the second horizontal grating region 50' and the second vertical grating region 60' can include portions of the patterned opaque layer. Specifically, a second horizontal grating within the second horizontal grating region 50' can be an array of horizontal lines of the patterned opaque layer, and a second vertical grating within the second vertical grating region 60' can be an array of vertical lines of the patterned opaque layer. The second lithographic feature region 22 can be a region in which portions of the patterned opaque layer are present, thereby providing the minimum transparency that the reticle 102 can provide.

The horizontal grating of the second horizontal grating region 50' is a subresolution grating. The width and pitch of each line components within the horizontal grating can be selected such that a direct image of the second horizontal grating region 50' is not physically present within a developed photoresist layer. In one embodiment, the percentage of the opaque areas within the second horizontal grating region 50' can be reduced, for example, below 50'%, so that the amount of illumination passing through the second horizontal grating region 50' at zeroth order is sufficient to cause substantially the same chemical changes in the portion of the photoresist corresponding to the second horizontal grating region 50' as in the portion of the photoresist corresponding to the second lithographic feature region 22.

The vertical grating of the second vertical grating region 60' is a subresolution grating. The width and pitch of each line components within the vertical grating can be selected such that a direct image of the second vertical grating region 60' is not physically present within a developed photoresist layer. In one embodiment, the percentage of the opaque areas within the second vertical grating region 60' can be reduced, for example, below 50%, so that the amount of illumination passing through the second vertical grating region 60' at zeroth order is sufficient to cause substantially the same chemical changes in the portion of the photoresist corresponding to the second vertical grating region 60' as in the portion of the photoresist corresponding to the second lithographic feature region 22.

In one embodiment, the second lithographic feature region 22 can be laterally bounded by a set of parallel edges such that the second horizontal grating region 50' contacts a first edge among the set of parallel edges, and the second vertical grating region 60' contacts a second edge among the set of parallel edges. In one embodiment, the second lithographic feature region 22 can have a rectangular shape. The width of the second horizontal grating region 50' (along the lengthwise direction of the horizontal gratings within the second horizontal grating region 50') may be the same as, or may be different from, the width of the second vertical grating region 60' (along the direction perpendicular to the direction of the vertical gratings within the second vertical grating region 60'). In one embodiment, the second horizontal grating region 50' and the second vertical grating region 60' can have substantially the same width.

In one embodiment, the relative location of the first horizontal grating region 50 with respect to the first lithographic feature region 12 can be in the opposite direction of the relative location of the second horizontal grating region 50' with respect to the second lithographic feature region 22.

In one embodiment, the first focus monitor unit 112 and the second focus monitor unit 122 can be mirror images of each other. In one embodiment, a plurality of first focus monitor units 112 and a plurality of second focus monitor units 122 can be within a one-dimensional periodic array having a periodicity along the lengthwise direction of horizontal gratings in the first and second horizontal grating regions (50, 50').

In one embodiment, the focus monitor can further include at least one first transparent region 32 and at least one second transparent region 42. Each of the at least one first transparent region 32 can be located between a pair of a first horizontal grating region 50 and a second horizontal grating region 50'. Each of the at least one second transparent region 42 can be located between a pair of a first vertical grating region 60 and a second vertical grating region 60'. In one embodiment, each first transparent region 32 can laterally contact a first horizontal grating region 50 and a second horizontal grating region 50', and each second transparent region 42 can laterally contact a first vertical grating region 60 and a second vertical grating region 60'.

In one embodiment, each of the first and second lithographic feature regions (12, 22) can have the same lateral width, i.e., a lateral distance between a pair of parallel edges that includes a proximal edge of a horizontal grating region (50 or 50') that adjoins the lithographic feature region (12 or 22) and a proximal edge of a vertical grating region (60 or 60') that adjoins the lithographic feature region (12 or 22). In this case, the lateral width of each of the first and second lithographic feature regions (12, 22) is referred to as a first width.

Additionally or alternately, each first transparent region 32 and each second transparent region 42 can have the same lateral width. In this case, the lateral width of each of the first and second transparent regions (32, 42) is referred to as a second width, which can be the same as, or different from, the first width.

In one embodiment, the focus monitor structure on the reticle 102 can include a sequence, from one side to another, of a first instance of a first focus monitor unit 112, an instance of a second transparent region 42, an instance of a second focus monitor unit 122, an instance of a first transparent region 32, and a second instance of the first focus monitor unit 112. The lateral distance between the geometrical center of the first instance of the first focus monitor unit 112 and the geometrical center of the instance of the second focus monitor unit 122 is herein referred to as a first mask distance M1', and the lateral distance between the geometrical center of the instance of the second focus monitor unit 122 and the geometrical center of the second instance of the first focus monitor unit 112 is herein referred to as a second mask distance M2'. The first mask distance M1' and the second mask distance M2' may, or may not, be the same. In one embodiment, the first mask distance M1' can be the same as the second mask distance M2'.

In addition to the at least one focus monitor structure, the reticle 102 can further include any additional structures that can be employed to form additional patterns on a photoresist layer. For example, the reticle 102 can include lithographic patterns for forming semiconductor devices at any lithographic level known in the art. In this case, the reticle 102 is referred to as a product reticle. In this case, lithographic patterns for semiconductor devices and at least one lithographic pattern including an image of the at least one focus monitor structure can be formed within a same photoresist layer on a substrate, which can be a semiconductor substrate as known in the art.

Figure 7:
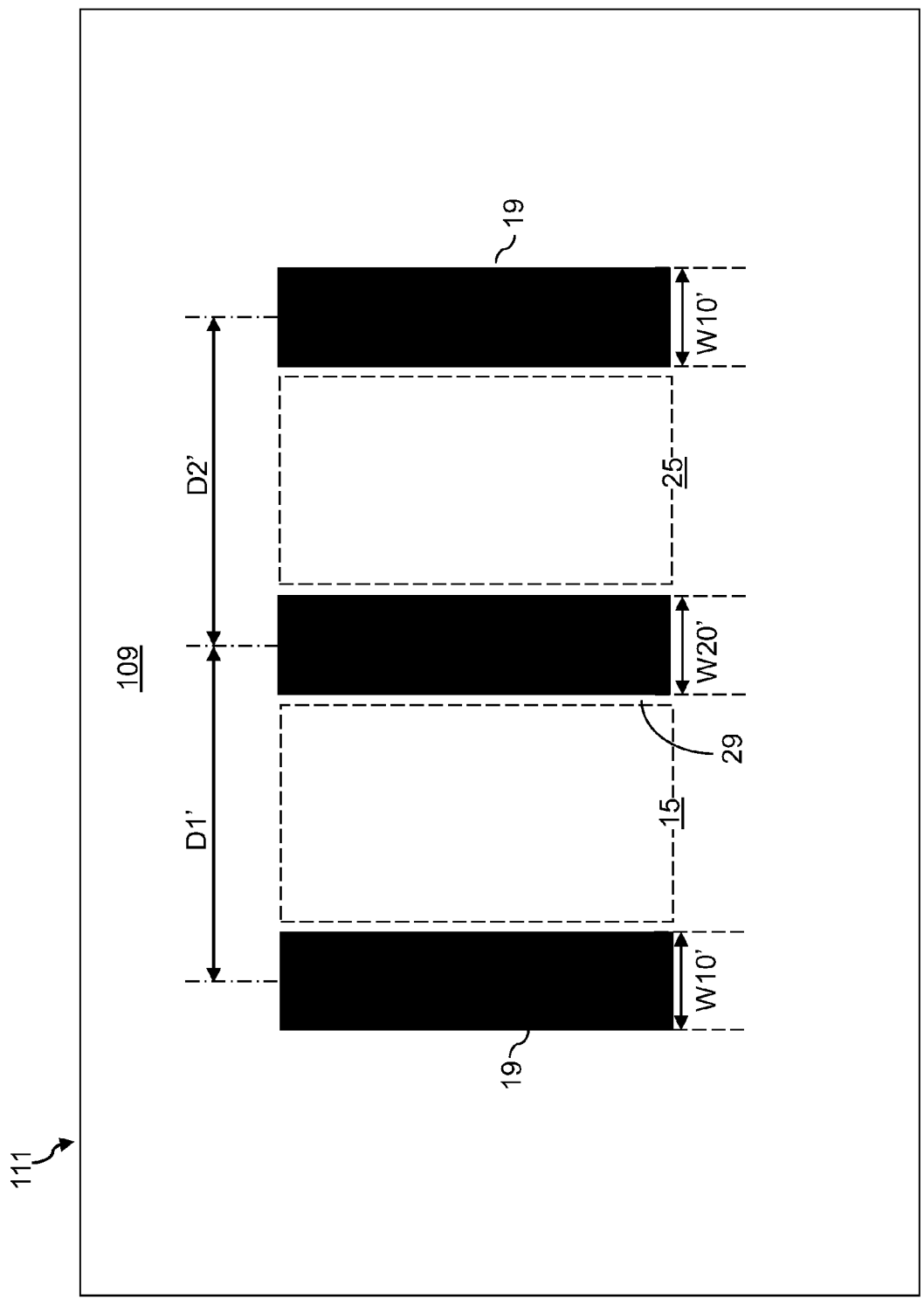
FIG. 7 is a top-down view of a portion of a patterned photoresist layer that has been lithographically exposed employing the second exemplary focus monitor structure at an optimal focus and subsequently developed according to an embodiment of the present disclosure.

Referring to FIG. 7, a patterned lithographic image in a photoresist layer can be generated by applying an unpatterned photoresist layer on a substrate 111, by lithographically exposing the photoresist layer employing a reticle 102 including a focus monitor structure such as the focus monitor structure in FIG. 6, and by developing the lithographically exposed photoresist layer. The vertical distance between the photoresist layer and the lens of the exposure tool employed to lithographically exposed the photoresist layer can be maintained at an optimal distance (which is the optimal focus) to generate the patterned lithographic image illustrated in FIG. 7.

In one embodiment, the illumination beam employed to lithographically expose the photoresist layer can be polarized along the lengthwise direction of the vertical gratings in the vertical grating regions (60, 60') of the reticle 102. In another embodiment, the illumination beam employed to lithographically expose the photoresist layer can be polarized along the lengthwise direction of the vertical gratings in the horizontal grating regions (50, 50') of the reticle 102. As used herein, the direction of polarization refers to the direction of the electrical field of an electromagnetic radiation, which is perpendicular to the direction of the magnetic field of the electromagnetic radiation and to the direction of propagation of the electromagnetic radiation. For example, if the illumination beam is polarized along the lengthwise direction of the vertical gratings in the vertical grating regions (60, 60') of the reticle 102, the electric field of the illumination beam is predominantly along the lengthwise direction of the vertical gratings in the vertical grating regions (60, 60') of the reticle 102.

The patterned photoresist layer can include at least one primary region 109 and at least one complementary region. The at least one primary region 109 (the white region of the substrate 111 in FIG. 7) and the at least one complementary region (the black regions of the substrate 111 in FIG. 7) are complements of each other. In one embodiment, the at least one complementary region can include at least one first opaque image region 19 that reproduces the pattern of the at least one first lithographic feature region 12 and at least one second opaque image region 29 that reproduces the pattern of the at least one second lithographic feature region 22. The area of the at least one primary region 109 and the area of the at least one complementary region (19, 29) are mutually exclusive of each other, and collectively encompass the entirety of the area in which the unpatterned photoresist layer is initially present prior to development. If the reticle 102 includes patterns for devices, i.e., product patterns, the at least one primary region 109 and the at least one complementary region (19, 29) can include additional regions that reproduce the product patterns. Thus, while the reference numeral 109 is associated with the at least one primary region 109, and the reference numerals (19, 29) are associated with the at least one complementary region (19, 29), it is understood that the at least one primary region may include first additional regions (not shown) and the at least one complementary region may include second additional regions (not shown) if the reticle includes product patterns.

In one embodiment, all portions of the at least one primary region 109 can be devoid of any photoresist material after development, and developed portions of the photoresist layer can be present in each of the at least one complementary region (19, 29). In this case, the area of the developed photoresist layer can coincide with the area of the at least one complementary region (19, 29), and the area from which the photoresist material of the developed photoresist layer is removed can coincide with the area of the at least one primary region 109.

In another embodiment, all portions of the at least one complementary region (19, 29) can be devoid of any photoresist material after development, and developed portions of the photoresist layer can be present in each of the at least one primary region 109. In this case, the area of the developed photoresist layer can coincide with the area of the at least one primary region 109, and the area from which the photoresist material of the developed photoresist layer is removed can coincide with the area of the at least one complementary region (19, 29).

The patterned photoresist layer includes an image of the at least one focus monitor structure. The printed image of the at least one focus monitor structure includes a first printed image component, which is a printed image of a first focus monitor unit 112. Because the first horizontal grating region 50 and the first vertical grating region 60 within each first focus monitor unit 112 do not generate a direct image, the first printed image component includes a first opaque image region 19 laterally adjoined by a set of transparent image regions. In this case, the first printed image component can consist of the first opaque image region 19.

Further, the printed image of the at least one focus monitor structure includes a second printed image component, which is a printed image of a second focus monitor unit 122. Because the second horizontal grating region 50' and the second vertical grating region 60' within each second focus monitor unit 122 do not generate a direct image, the second printed image component includes a second opaque image region 29 laterally adjoined by a set of transparent image regions. In this case, the second printed image component can consist of the second opaque image region 29.

In one embodiment, each first opaque image region 19 can be laterally bounded by a set of parallel edges. Likewise, each second transparent image region 29 can be laterally bounded by a set of parallel edges. In one embodiment, each first opaque image region 19 and each second opaque image region 29 can have a rectangular shape.

Each first opaque image region 19 can have a lateral width in the direction of at least one repetition of the first opaque image region(s) 19 and the second opaque image region(s) 29. The lateral width of a first opaque image region 19 is herein referred to as a first opaque region nominal width W10'. Likewise, each second opaque image region 29 can have a lateral width in the direction of at least one repetition of the first opaque image region(s) 19 and the second opaque image region(s) 29. The lateral width of a second opaque image region 29 is herein referred to as a second opaque region nominal width W20'.

Under the condition of the optimal focus, the electromagnetic field effects of the polarized illumination beam due to a horizontal grating region (50 or 50') and a vertical grating region (60 or 60') within each focus monitor unit (112 or 122) does not cause any lateral shifting of the image of the focus monitor unit (112 or 122). Thus, the location of the center of each first opaque image region 19 under the condition of optimal focus is identical to the location of a corresponding image that would be obtained from a hypothetical reticle in which all of the horizontal grating regions (50, 50') and the vertical grating regions (60, 60') are removed, i.e., replaced with transparent regions. Likewise, the location of the center of each second opaque image region 29 under the condition of the optimal focus is identical to the location of a corresponding image that would be obtained from a hypothetical reticle in which all of the horizontal grating regions (50, 50') and the vertical grating regions (60, 60') are removed.

In one embodiment, the pattern on the reticle substrate 100 can include a sequence, from one side to another, of a first instance of a first focus monitor unit 112, an instance of a second transparent region 42, an instance of a second focus monitor unit 122, an instance of a first transparent region 32, and a second instance of the first focus monitor unit 112. In this case, the patterned photoresist layer on the substrate 111 can include a sequence, from one side to another, of a first instance of a first opaque image region 19, a first transparent image region 15, an instance of a second opaque image region 29, a second transparent image region 25, and a second instance of the first opaque image region 19.

The lateral distance between the geometrical center of the first instance of the first opaque image region 19 and the geometrical center of the instance of the second opaque image region 29 is herein referred to as a first printed image nominal distance D10', and the lateral distance between the geometrical center of the instance of the second opaque image region 29 and the geometrical center of the second instance of the first opaque image region 19 is herein referred to as a second printed image nominal distance D20'. Under the condition of optimal focus, the ratio of the first mask distance M1' to the second mask distance M2' is the same as the ratio of the first printed image nominal distance D10' to the second printed image nominal distance D20'. If the first mask distance M1' is the same as the second mask distance M2', the first printed image nominal distance D10' is the same as the second printed image nominal distance D20'.

Figure 8:
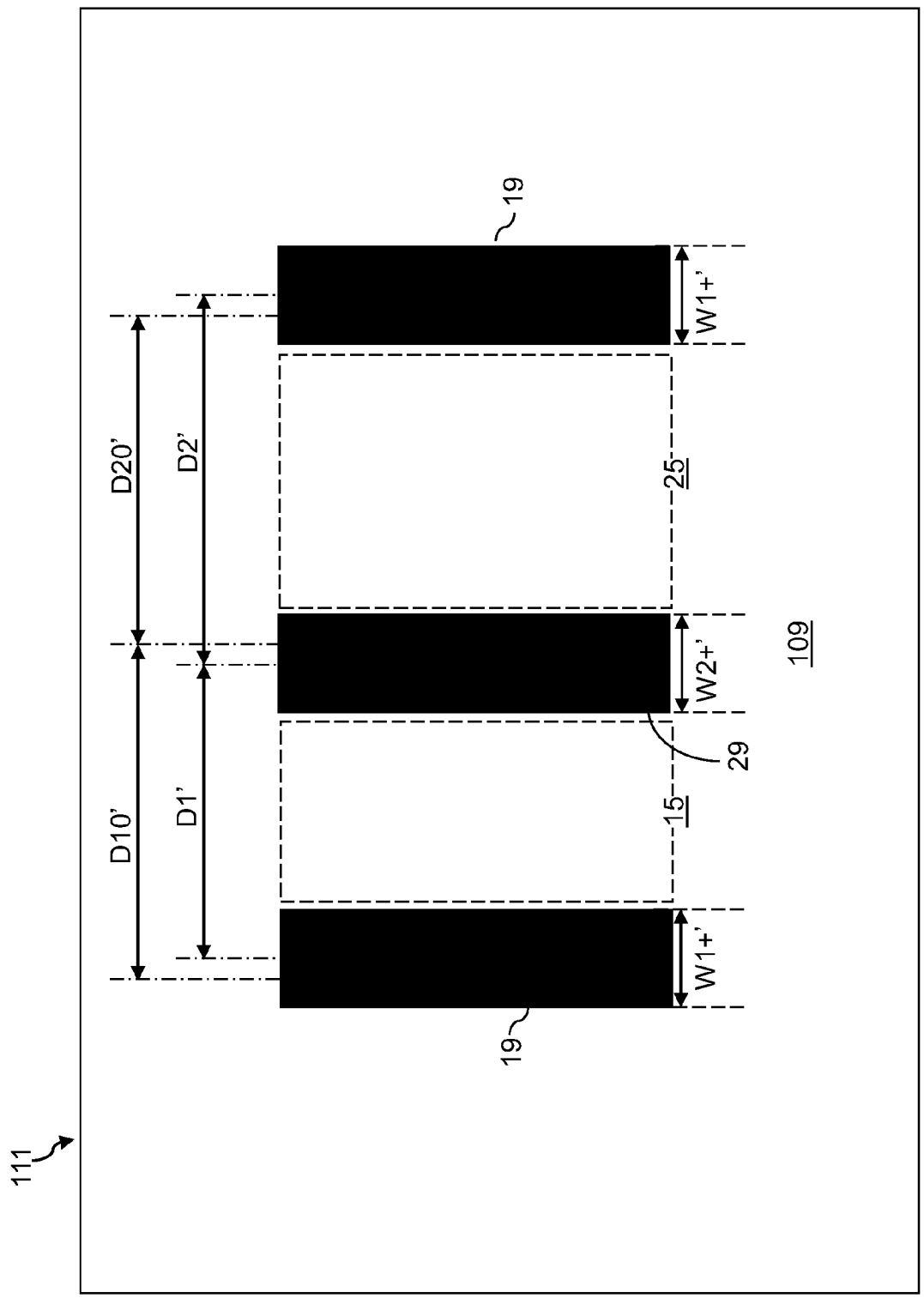
FIG. 8 is a top-down view of a portion of a patterned photoresist layer that has been lithographically exposed employing the second exemplary focus monitor structure with a first non-zero focus offset and subsequently developed according to an embodiment of the present disclosure.

Referring to FIG. 8, a patterned lithographic image in a photoresist layer can be generated by applying an unpatterned photoresist layer on a substrate 111, by lithographically exposing the photoresist layer employing a reticle 102 including a focus monitor structure at a setting in which the vertical distance between the photoresist layer and the lens of the exposure tool employed to lithographically exposed the photoresist layer is maintained at a non-optimal distance, and by developing the lithographically exposed photoresist layer.

In one embodiment, the image of the patterned photoresist layer as illustrated in FIG. 8 can be obtained by employing a polarized illumination beam that is polarized along the lengthwise direction of the vertical gratings in the vertical grating regions (60, 60') of the reticle 102, and by setting the non-zero focus offset (which is herein referred to as a first non-zero offset) as a positive offset, i.e., by reducing the vertical distance between the photoresist layer and the lens of the exposure tool employed to lithographically expose the photoresist layer.

In another embodiment, the image of the patterned photoresist layer as illustrated in FIG. 8 can be obtained by employing a polarized illumination beam that is polarized along the lengthwise direction of the horizontal gratings in the horizontal grating regions (50, 50') of the reticle 102, and by setting the non-zero focus offset (which is herein referred to as a first non-zero offset) as a negative offset, i.e., by increasing the vertical distance between the photoresist layer and the lens of the exposure tool employed to lithographically expose the photoresist layer.

Under any of the two combinations of the polarization of the illumination beam and the polarity of the focus offset for forming the pattern of FIG. 8, each first printed image component, which is a printed image of a first focus monitor unit 112, shifts toward the direction of the first vertical grating region 60 relative to the first lithographic feature region 12 within the first focus monitor unit 112 due to the electromagnetic field effects of the sub-resolution features present within the first horizontal grating region 50 and the first vertical grating region 60 within the first focus monitor unit 112. The electromagnetic field effect upon the polarized illumination beam is the net effect of interferences of various rays of the polarized illumination beam through the first horizontal grating region 50, the first vertical grating region 60, and the first lithographic feature region 12. The first horizontal grating region 50 and the first vertical grating region 60 effectively function as weak phase shifters that laterally shift the image of the first focus monitor unit 112 along the direction of the relative direction of the first vertical grating region 60 relative to the first lithographic feature region 12.

Likewise, under any of the two combinations of the polarization of the illumination beam and the polarity of the focus offset described above, each second printed image component, which is a printed image of a second focus monitor unit 122, shifts toward the direction of the second vertical grating region 60' relative to the second lithographic feature region 22 within the second focus monitor unit 122 due to the electromagnetic field effects of the sub-resolution features present within the second horizontal grating region 50' and the second vertical grating region 60' within the second focus monitor unit 122. The electromagnetic field effect upon the polarized illumination beam is the net effect of interferences of various rays of the polarized illumination beam through the second horizontal grating region 50', the second vertical grating region 60', and the second lithographic feature region 22. The second horizontal grating region 50' and the second vertical grating region 60' effectively function as weak phase shifters that laterally shift the image of the second focus monitor unit 122 along the direction of the relative direction of the second vertical grating region 60' relative to the second lithographic feature region 22.

The width of each first opaque image region 19 under such exposure conditions is herein referred to as a first opaque region first-non-nominal width W1+', which can be substantially the same as the first opaque region nominal width W10'. Further, the width of each second opaque image region 29 under such exposure conditions is herein referred to as a second opaque region first-non-nominal width W2+', which can be substantially the same as the first opaque region nominal width W20'. The width of the first transparent image region 15 is less than the corresponding width of the first transparent image region 15 under the optimal focus condition shown in FIG. 7, i.e., under a zero focus offset. The width of the second transparent image region 25 is grater than the corresponding width of the second transparent image region 25 under the optimal focus condition shown in FIG. 7.

The electromagnetic field effects of the polarized illumination beam due to a horizontal grating region (50 or 50') and a vertical grating region (60 or 60') within each focus monitor unit (112 or 122) causes any lateral shifting of the image of the focus monitor unit (112 or 122). Thus, the location of the center of each first opaque image region 19 under the condition of a non-optimal focus is different from the location of a corresponding image that would be obtained from a hypothetical reticle in which all of the horizontal grating regions (50, 50') and the vertical grating regions (60, 60') are removed, i.e., replaced with transparent regions. Likewise, the location of the center of each second opaque image region 29 under the condition of the non-optimal focus is different from the location of a corresponding image that would be obtained from a hypothetical reticle in which all of the horizontal grating regions (50, 50') and the vertical grating regions (60, 60') are removed.

If each first focus monitor unit 112 is a mirror image of any of the second focus monitor unit, the location of the center of each first transparent image region 15 and the location of the center of each second transparent image region 25 do not shift under the condition of a non-optimal focus relative to the condition of the optimal focus. Thus, the location of the center of each first transparent image region 15 and the location of the center of each second transparent image region 25 can function as invariant points that do not change with variations in the focus offset in a lithographic exposure tool.

In one embodiment, the pattern on the reticle substrate 100 can include a sequence, from one side to another, of a first instance of a first focus monitor unit 112, an instance of a second transparent region 42, an instance of a second focus monitor unit 122, an instance of a first transparent region 32, and a second instance of the first focus monitor unit 112. In this case, the patterned photoresist layer on the substrate 111 can include a sequence, from one side to another, of a first instance of a first opaque image region 19, a first transparent image region 15, an instance of a second opaque image region 29, a second transparent image region 25, and a second instance of the first opaque image region 19.

The lateral distance between the geometrical center of the first instance of the first opaque image region 19 and the geometrical center of the instance of the second opaque image region 29 is herein referred to as a first printed image distance D1', which is less than the first printed image nominal distance D10'. The lateral distance between the geometrical center of the instance of the second opaque image region 29 and the geometrical center of the second instance of the first opaque image region 19 is herein referred to as a second printed image distance D2', which is greater than the second printed image nominal distance D20'. Under the condition of a non-optimal focus in which the polarization of the illumination beam is along the vertical direction and the focus offset is positive or under the condition of a non-optimal focus in which the polarization of the illumination beam is along the horizontal direction and the focus offset is negative, the ratio of the first printed image distance D1' to the second printed image distance D2' is less than the ratio of the first mask distance M1' to the second mask distance M2'. If the first mask distance M1' is the same as the second mask distance M2', the ratio of the first printed image distance D1' to the second printed image distance D2' is less than 1.0. The degree of deviation in the ratio of the first printed image distance D1' to the second printed image distance D2' from the ratio of the first mask distance M1' to the second mask distance M2' is proportional to the magnitude of the focus offset to first order.

Figure 9:
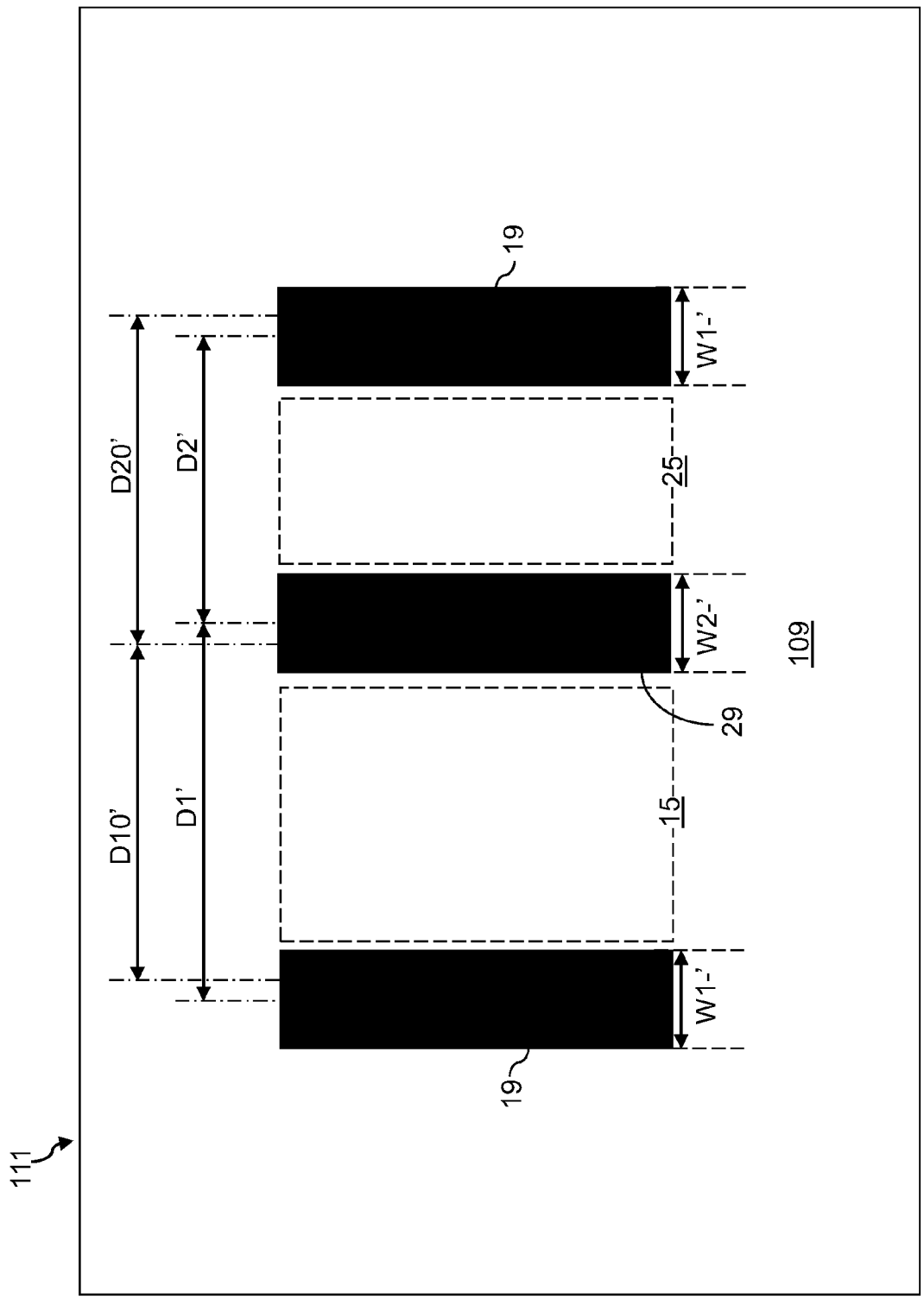
FIG. 9 is a top-down view of a portion of a patterned photoresist layer that has been lithographically exposed employing the second exemplary focus monitor structure with a second non-zero focus offset and subsequently developed according to an embodiment of the present disclosure.

Referring to FIG. 9, a patterned lithographic image in a photoresist layer can be generated by applying an unpatterned photoresist layer on a substrate 111, by lithographically exposing the photoresist layer employing a reticle 102 including a focus monitor structure at a setting in which the vertical distance between the photoresist layer and the lens of the exposure tool employed to lithographically exposed the photoresist layer is maintained at a non-optimal distance, and by developing the lithographically exposed photoresist layer.

In one embodiment, the image of the patterned photoresist layer as illustrated in FIG. 9 can be obtained by employing a polarized illumination beam that is polarized along the lengthwise direction of the horizontal gratings in the horizontal grating regions (50, 50') of the reticle 102, and by setting the non-zero focus offset (which is herein referred to as a first non-zero offset) as a positive offset, i.e., by reducing the vertical distance between the photoresist layer and the lens of the exposure tool employed to lithographically expose the photoresist layer.

In another embodiment, the image of the patterned photoresist layer as illustrated in FIG. 9 can be obtained by employing a polarized illumination beam that is polarized along the lengthwise direction of the vertical gratings in the vertical grating regions (60, 60') of the reticle 102, and by setting the non-zero focus offset (which is herein referred to as a first non-zero offset) as a negative offset, i.e., by increasing the vertical distance between the photoresist layer and the lens of the exposure tool employed to lithographically expose the photoresist layer.

Under any of the two combinations of the polarization of the illumination beam and the polarity of the focus offset for generating the pattern in FIG. 9, each first printed image component, which is a printed image of a first focus monitor unit 112, shifts toward the direction of the first horizontal grating region 50 relative to the first lithographic feature region 12 within the first focus monitor unit 112 due to the electromagnetic field effects of the sub-resolution features present within the first horizontal grating region 50 and the first vertical grating region 60 within the first focus monitor unit 112. The electromagnetic field effect upon the polarized illumination beam is the net effect of interferences of various rays of the polarized illumination beam through the first horizontal grating region 50, the first vertical grating region 60, and the first lithographic feature region 12. The first horizontal grating region 50 and the first vertical grating region 60 effectively function as weak phase shifters that laterally shift the image of the first focus monitor unit 112 along the direction of the relative direction of the first horizontal grating region 50 relative to the first lithographic feature region 12.

Likewise, under any of the two combinations of the polarization of the illumination beam and the polarity of the focus offset described above, each second printed image component, which is a printed image of a second focus monitor unit 122, shifts toward the direction of the second horizontal grating region 50' relative to the second lithographic feature region 22 within the second focus monitor unit 122 due to the electromagnetic field effects of the sub-resolution features present within the second horizontal grating region 50' and the second vertical grating region 60' within the second focus monitor unit 122. The electromagnetic field effect upon the polarized illumination beam is the net effect of interferences of various rays of the polarized illumination beam through the second horizontal grating region 50', the second vertical grating region 60', and the second lithographic feature region 22. The second horizontal grating region 50' and the second vertical grating region 60' effectively function as weak phase shifters that laterally shift the image of the second focus monitor unit 122 along the direction of the relative direction of the second horizontal grating region 50' relative to the second lithographic feature region 22.

The width of each first opaque image region 19 under such exposure conditions is herein referred to as a first opaque region second-non-nominal width W1−', which can be substantially the same as the first opaque region nominal width W20'. Further, the width of each second opaque image region 29 under such exposure conditions is herein referred to as a second opaque region second-non-nominal width W2−', which can be substantially the same as the second opaque region nominal width W20'. The width of the first transparent image region 15 is greater than the corresponding width of the first transparent image region 15 under the optimal focus condition shown in FIG. 7, i.e., under a zero focus offset. The width of the second transparent image region 25 is less than the corresponding width of the second transparent image region 25 under the optimal focus condition shown in FIG. 7.

The electromagnetic field effects of the polarized illumination beam due to a horizontal grating region (50 or 50') and a vertical grating region (60 or 60') within each focus monitor unit (112 or 122) causes any lateral shifting of the image of the focus monitor unit (112 or 122). Thus, the location of the center of each first opaque image region 19 under the condition of a non-optimal focus is different from the location of a corresponding image that would be obtained from a hypothetical reticle in which all of the horizontal grating regions (50, 50') and the vertical grating regions (60, 60') are replaced with transparent regions. Likewise, the location of the center of each second opaque image region 29 under the condition of the non-optimal focus is different from the location of a corresponding image that would be obtained from a hypothetical reticle in which all of the horizontal grating regions (50, 50') and the vertical grating regions (60, 60') are removed.

If each first focus monitor unit 112 is a mirror image of any of the second focus monitor unit, the location of the center of each first transparent image region 15 and the location of the center of each second transparent image region 25 do not shift under the condition of a non-optimal focus relative to the condition of the optimal focus. Thus, the location of the center of each first transparent image region 15 and the location of the center of each second transparent image region 25 can function as invariant points that do not change with variations in the focus offset in a lithographic exposure tool.

In one embodiment, the pattern on the reticle substrate 102 can include a sequence, from one side to another, of a first instance of a first focus monitor unit 112, an instance of a second transparent region 42, an instance of a second focus monitor unit 122, an instance of a first transparent region 32, and a second instance of the first focus monitor unit 112. In this case, the patterned photoresist layer on the substrate 111 can include a sequence, from one side to another, of a first instance of a first opaque image region 19, a first transparent image region 15, an instance of a second opaque image region 29, a second transparent image region 25, and a second instance of the first opaque image region 19.

The lateral distance between the geometrical center of the first instance of the first opaque image region 19 and the geometrical center of the instance of the second opaque image region 29 is herein referred to as a first printed image second-non-nominal distance D1−', which is greater than the first printed image nominal distance D10'. The lateral distance between the geometrical center of the instance of the second opaque image region 29 and the geometrical center of the second instance of the first opaque image region 19 is herein referred to as a second printed image second-non-nominal distance D2−', which is less than the second printed image nominal distance D20'. Under the condition of a non-optimal focus in which the polarization of the illumination beam is along the horizontal direction and the focus offset is positive or under the condition of a non-optimal focus in which the polarization of the illumination beam is along the vertical direction and the focus offset is negative, the ratio of the first printed image second-non-nominal distance D1−' to the second printed image second-non-nominal distance D2−' is greater than the ratio of the first mask distance M1' to the second mask distance M2'. If the first mask distance M1' is the same as the second mask distance M2', the ratio of the first printed image second-non-nominal distance D1−' to the second printed image second-non-nominal distance D2−' is greater than 1.0. The degree of deviation in the ratio of the first printed image second-non-nominal distance D1−' to the second printed image second-non-nominal distance D2−' from the ratio of the first mask distance M1' to the second mask distance M2' is proportional to the magnitude of the focus offset to first order.

Figure 10:
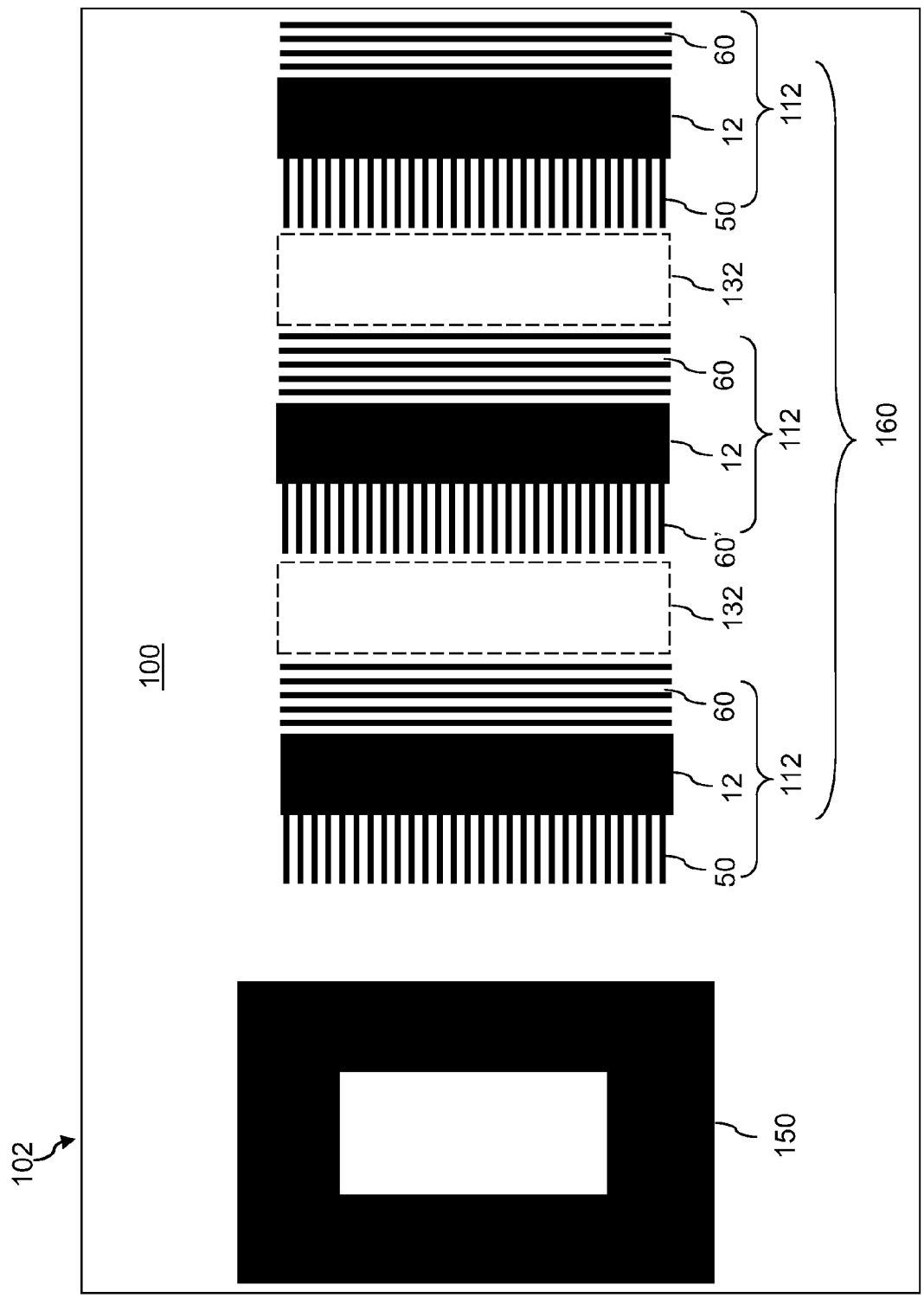
FIG. 10 is a top-down view of a portion of a third exemplary focus monitor structure on a reticle according to an embodiment of the present disclosure.

Referring to FIG. 10, a third exemplary focus monitor structure on a reticle 102 is shown according to an embodiment of the present disclosure. The reticle 102 can have any type of substrate as known in the art. In one embodiment, the reticle 102 includes a reticle substrate 100 which is a transparent substrate. The reticle 102 can be a chrome-on glass (COG) mask, an opaque MoSi on glass (OMOG) mask, a phase shift mask (PSM), or an attenuated phase shift mask (attenuated PSM) as known in the art. The reticle substrate 100 can have the same thickness throughout the entirety thereof, or can include a region having the same thickness. The reticle substrate 100 can be transparent throughout the entirety thereof.

The reticle 102 can include at least one focus monitor structure. Each focus monitor structure includes one or more focus monitor units. For example, the focus monitor structure illustrated in FIG. 9 can include at least one first focus monitor unit 112 and a reference structure 150.

Each first focus monitor unit 112 can be the same as in the exemplary focus monitor structure described above. Multiple instances of first focus monitor units 112 can be repeated without any change in shape except for lateral displacement. In other words, rotation or mirror image generation is not employed. The multiple instances of the focus monitor units 112 can constitute a periodic one-dimensional array 160 of focus monitor structures. Each adjacent pair of first focus monitor units 112 can be laterally separated by a first transparent region 132, which can have the same physical structure as the first transparent regions 32 in the second exemplary focus monitor structure.

The reference structure 150 can be any lithographic feature that can be identified by its shape. The reference structure 150 does not include on the periphery thereof to avoid any lateral shifting of images due to electromagnetic field effects within a lithographic image thereof.

Figure 11:
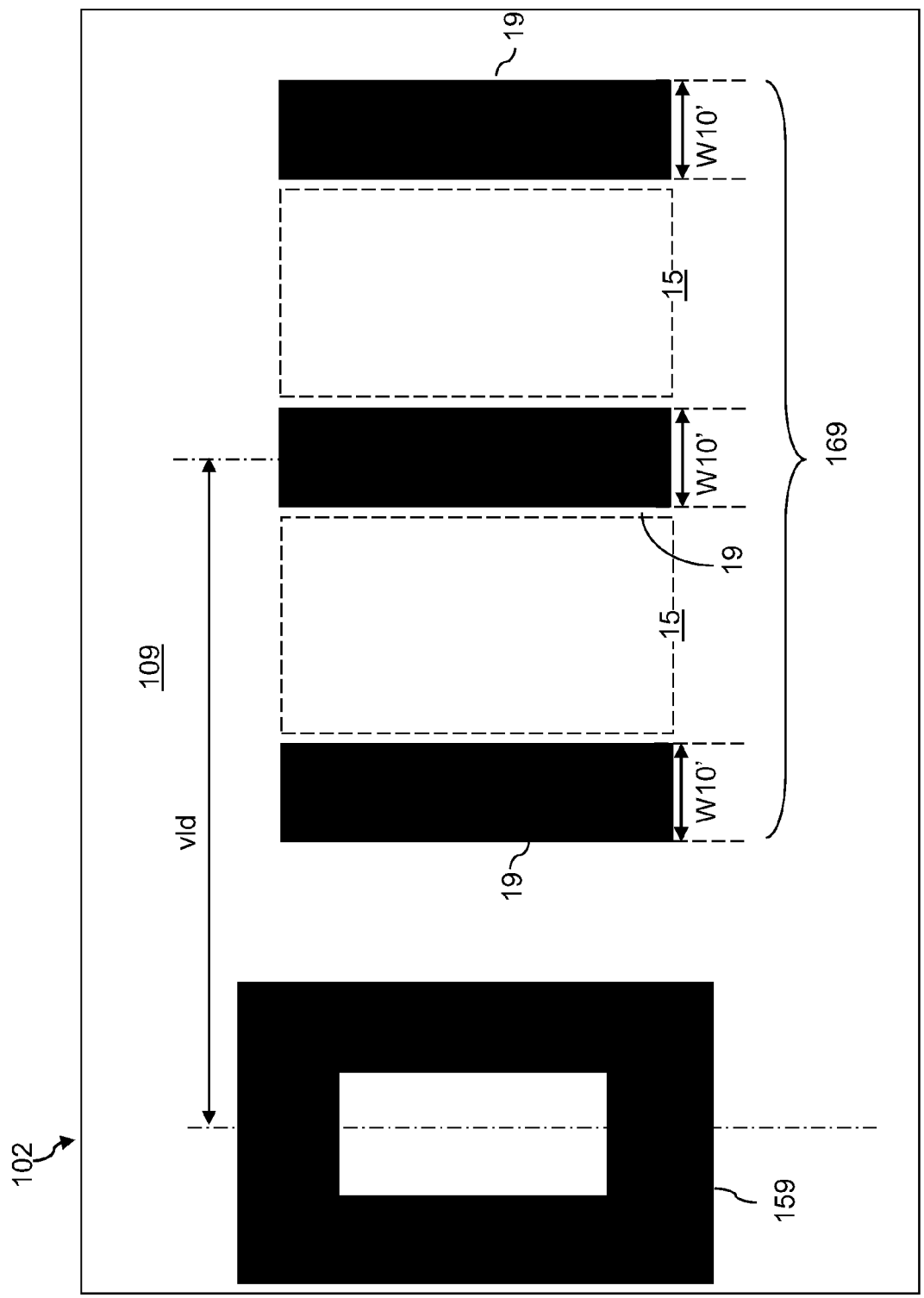
FIG. 11 is a top-down view of a portion of a patterned photoresist layer that has been lithographically exposed employing the third exemplary focus monitor structure according to an embodiment of the present disclosure.

Referring to FIG. 11, a patterned lithographic image in a photoresist layer can be generated by applying an unpatterned photoresist layer on a substrate 111, by lithographically exposing the photoresist layer employing a reticle 102 including a focus monitor structure such as the focus monitor structure in FIG. 10, and by developing the lithographically exposed photoresist layer.

The patterned photoresist layer can include at least one primary region 109 and at least one complementary region. The at least one primary region 109 (the white region of the substrate 111 in FIG. 11) and the at least one complementary region (the black regions of the substrate 111 in FIG. 11) are complements of each other. In one embodiment, the at least one complementary region can include a focus-dependent opaque image region 169 and a reference opaque image region 159 that reproduces the pattern of the reference structure 150. The focus-dependent opaque image region 169 includes a plurality of first opaque image regions 19 that reproduces the pattern of the plurality of first lithographic feature regions 12. The area of the at least one primary region 109 and the area of the at least one complementary region (159, 169) are mutually exclusive of each other, and collectively encompass the entirety of the area in which the unpatterned photoresist layer is initially present prior to development. If the reticle 102 includes patterns for devices, i.e., product patterns, the at least one primary region 109 and the at least one complementary region (159, 169) can include additional regions that reproduce the product patterns. Thus, while the reference numeral 109 is associated with the at least one primary region 109, and the reference numerals (159, 169) are associated with the at least one complementary region (159, 169), it is understood that the at least one primary region may include first additional regions (not shown) and the at least one complementary region may include second additional regions (not shown) if the reticle includes product patterns.

In one embodiment, all portions of the at least one primary region 109 can be devoid of any photoresist material after development, and developed portions of the photoresist layer can be present in each of the at least one complementary region (159, 169). In this case, the area of the developed photoresist layer can coincide with the area of the at least one complementary region (159, 169), and the area from which the photoresist material of the developed photoresist layer is removed can coincide with the area of the at least one primary region 109.

In another embodiment, all portions of the at least one complementary region (159, 169) can be devoid of any photoresist material after development, and developed portions of the photoresist layer can be present in each of the at least one primary region 109. In this case, the area of the developed photoresist layer can coincide with the area of the at least one primary region 109, and the area from which the photoresist material of the developed photoresist layer is removed can coincide with the area of the at least one complementary region (159, 169).

A lateral distance between the geometrical center of the reference opaque image region 159 and the geometrical center of the focus dependent opaque image region 169 varies depending on the focus offset and the polarization of the illumination beam. The lateral distance is herein referred to as a variable lateral distance vld.

In one embodiment, the illumination beam employed to lithographically expose the photoresist layer can be polarized along the lengthwise direction of the vertical gratings in the first vertical grating regions 60 of the reticle 102. In this case, the variable lateral distance vld increases with the focus offset. For example, the location of the focus dependent opaque image region 169 shifts to the right with a positive focus offset (the vertical distance between the photoresist layer being less than the optimal focus), and shifts to the left with a negative focus offset.

In another embodiment, the illumination beam employed to lithographically expose the photoresist layer can be polarized along the lengthwise direction of the horizontal gratings in the first vertical grating regions 60 of the reticle 102. In this case, the variable lateral distance vld decreases with the focus offset. For example, the location of the focus dependent opaque image region 169 shifts to the left with a positive focus offset (the vertical distance between the photoresist layer being less than the optimal focus), and shifts to the right with a negative focus offset.

Therefore, the focus offset can be measured for a given polarization by measuring the variable lateral distance vld within the developed image. The geometrical center of the reference opaque image region 159 can be replaced with any other location of the image of the reference opaque image region 159 that does not move with the focus offset. Further, the geometrical center of the focus dependent opaque image region 169 can be replaced with any location of the image of the focus dependent opaque image region 169 that move with the focus offset.

The spacing between an adjacent pair of first opaque image regions 19, i.e., the width of the first transparent image regions 15, can be substantially invariant under changes in the focus offset. Further, the width of each first opaque image region 19 can also be invariant under changes in the focus offset, and stay at the first opaque region nominal width W10' described above.

In one embodiment, the orientation of the first vertical grating regions 60 relative to the first horizontal grating regions 50 may be reversed. In one embodiment, the locations of the first lithographic feature regions 12 and a first transparent region 132 may be reversed.

Figure 12:
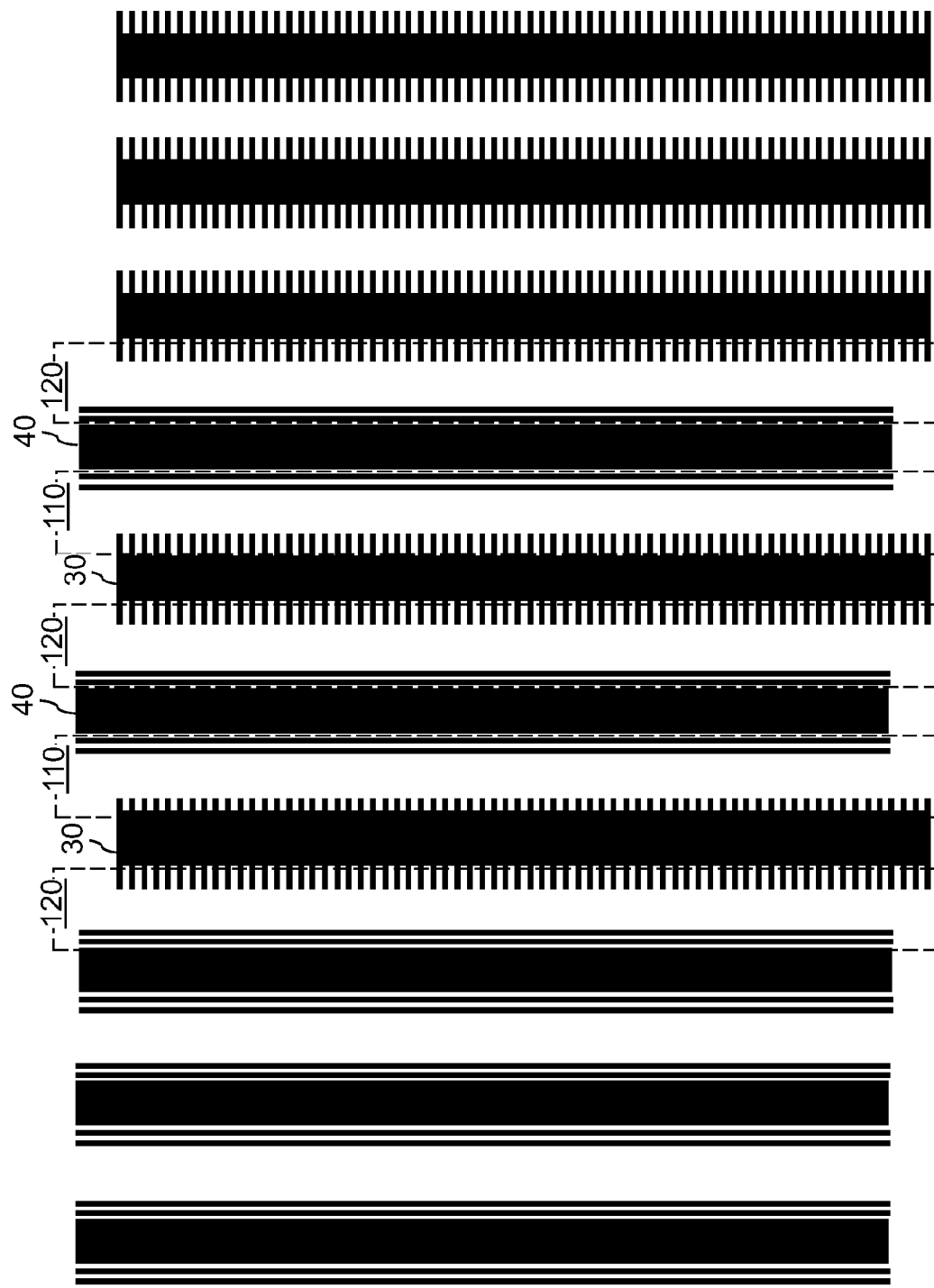
FIG. 12 is a top-down view of a fourth exemplary focus monitor structure on a reticle according to an embodiment of the present disclosure.

Referring to FIG. 12, a fourth exemplary focus monitor structure formed on a reticle is shown. The fourth exemplary focus monitor structure is a variation of the first exemplary focus monitor structure derived by vertically offsetting various components of the first exemplary focus monitor structure and by adding peripheral structures designed to minimize the effect of the termination of the sequence in the first exemplary focus monitor structure.

In general, the various parameters of the horizontal gratings in the horizontal grating regions (50, 50'; See FIGS. 1A, 1B, and 5) and the various parameters of the vertical grating regions (60, 60'; See FIGS. 1A, 1B, and 5) can be selected for optimal performance of the focus monitor structures. One metric for measuring performance of a focus monitor structure of the embodiments of the present disclosure can be the magnitude of the change in the lateral distance between the geometrical center of an instance of the first transparent image region 119 and the geometrical center of an instance of the second transparent image region 129 that is adjacent to the instance of the first transparent image region as illustrated in FIGS. 2, 3, and 4, or the magnitude of the change in the lateral distance between the geometrical center of an instance of the second opaque image region 29 and the geometrical center of the second instance of the first opaque image region 19 that is adjacent to the second opaque image region 29 as illustrated in FIGS. 6, 7, 8.

The various parameters of the horizontal gratings in the horizontal grating regions (50, 50'; See FIGS. 1A, 1B, and 5) include the pitch of the horizontal gratings (i.e., the first pitch), the duty cycle of the horizontal grating (i.e., the percentage of the opaque area relative to the total area within the horizontal grating region), the length of the horizontal grating lines (i.e., the width of the horizontal grating region), and the number of repetition of the horizontal grating lines (i.e., how many horizontal grating lines are present in a horizontal grating region). In one embodiment, the first pitch can be from $0.2 \times \lambda/NA$ to $0.5 \times \lambda/NA$, in which $\lambda$ is the wavelength of the illumination beam of the exposure tool to be employed, and NA is the numerical aperture of the exposure tool. It is noted that the minimum dimension of a single (non-periodic) printed feature is given by $k_1 \times \lambda/NA$, in which the coefficient $k_1$ is about 0.4. The duty cycle of the horizontal gratings can be, for example, from 0.25 to 0.75, although lesser and greater duty cycles can also be employed. The length of the horizontal grating lines can be, for example, from $0.4 \times \lambda/NA$ to $2.0 \times \lambda/NA$, although lesser and greater lengths can also be employed. The number of repetition of the horizontal grating lines can be, for example, from 10 to 1,000, although lesser and greater number of repetition can also be employed.

The various parameters of the vertical gratings in the vertical grating regions (60, 60'; See FIGS. 1A, 1B, and 5) include the pitch of the vertical gratings (i.e., the second pitch), the duty cycle of the vertical grating (i.e., the percentage of the opaque area relative to the total area within the vertical grating region), the length of the vertical grating lines (i.e., the height of the vertical grating region in the direction perpendicular to the width), and the number of repetition of the vertical grating lines (i.e., how many vertical grating lines are present in a vertical grating region). In one embodiment, the second pitch can be from $0.2 \times \lambda/NA$ to $0.5 \times \lambda/NA$. The duty cycle of the vertical gratings can be, for example, from 0.25 to 0.75, although lesser and greater duty cycles can also be employed. The length of the vertical grating lines can be, for example, from $1.0 \times \lambda/NA$ to $200 \times \lambda/NA$, although lesser and greater lengths can also be employed. The number of repetition of the vertical grating lines can be, for example, from 1 to 4, although lesser and greater number of repetition can also be employed.

Figure 13:
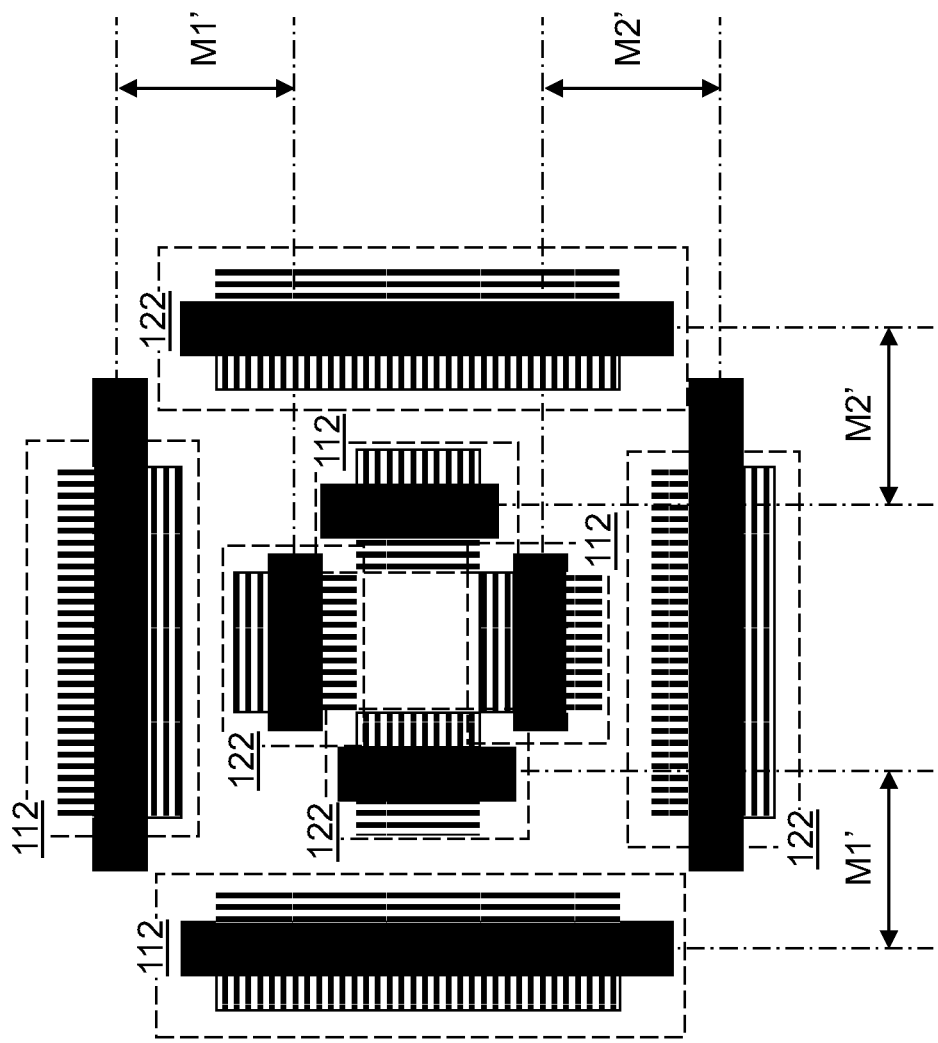
FIG. 13 is a top-down view of a fifth exemplary focus monitor structure on a reticle according to an embodiment of the present disclosure.

The various focus monitor structures can be implemented in various configurations. For example, FIG. 13 illustrates a fifth exemplary focus monitor structure on a reticle, which includes a plurality of first focus monitor units 112 and a plurality of second focus monitor units 122 that are arranged in a box-in-a-box configuration. The space between each adjacent pair of a first focus monitor unit 112 and a second focus monitor unit 122 within a same azimuthal angle range with respect to the geometrical center of the fifth exemplary focus monitor structure can be measured to determine the focus offset at any setting of a vertical distance between a photoresist layer on a substrate and the lens of a lithographic exposure tool.

Figure 14:
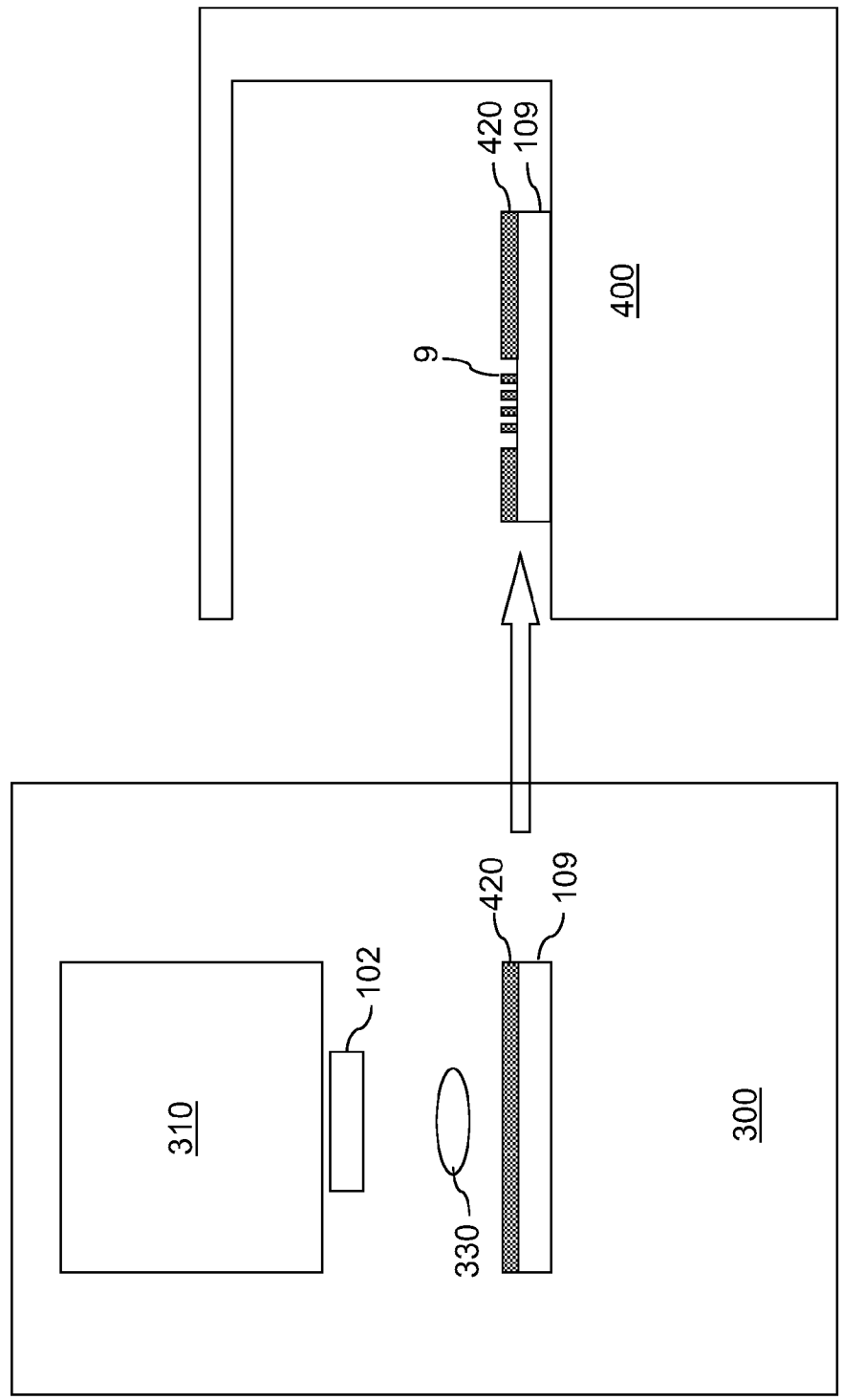
FIG. 14 is a schematic drawing representing the process of lithographic exposure and development and measurement of the shift of the printed image in a metrology tool according to an embodiment of the present disclosure.

Referring to FIG. 14, the process of lithographic exposure and development in an exposure tool 300 (i.e., a lithographic exposure tool) and measurement of the shift of the printed image in a metrology tool 400 is schematically illustrated. The lithographic exposure tool 300 includes a polarized light source 310. A reticle 102 according to one of the embodiments of the present disclosure can be loaded into the lithographic exposure tool 310. The vertical distance between a photoresist layer 420 on a substrate 109 and the lens 330 of the exposure tool 300 is set at a fixed distance during the lithographic exposure of the photoresist layer 420. The photoresist layer 420 is subsequently developed.

Subsequently, the substrate 109 with a developed photoresist layer 420 includes printed images 9 of the at least one focus monitor structure. The dimensions of the features of the printed image 9 is subsequently measured in the metrology tool 400 to determine the focus offset at the time of exposure of the photoresist layer 420 in the lithographic exposure tool 300. The measured data on the focus offset can be provided to an automated process control (APC) system to control the focus offset of the lithographic exposure tool in subsequent lithographic exposure of additional substrates with a photoresist layer thereupon.

According to an embodiment of the present disclosure, a lithographic system can include an exposure tool 300 and a reticle 102. The exposure tool 300 can be configured to print a periodic one-dimensional array of lines and spaces at a pitch not less than a minimum lithographic pitch. In other words, the minimum lithographic pitch is the minimum pitch that the exposure tool 300 can print.

The horizontal grating regions (50, 50') of the at least one focus monitor structure can include horizontal gratings having a first pitch that is less than the minimum lithographic pitch, and the vertical grating regions (60, 60') can include vertical gratings having a second pitch that is less than the minimum lithographic pitch.

The exposure tool 300 can include a light source configured to emit a polarized electromagnetic radiation. The direction of polarization can be selected from the direction that is parallel to the lengthwise direction of the horizontal gratings within the horizontal grating regions (50, 50') and the direction that is parallel to the lengthwise direction of the vertical grating within the vertical grating regions (60, 60').

A focus offset of a lithographic system can be measured by providing a reticle 102 including a focus monitor structure. The focus monitor structure includes at least a lithographic feature region (110, 120, 112, or 122) having a same transmission coefficient for electromagnetic radiation throughout, a horizontal grating region (50 or 50') located on a first side of the lithographic feature region, and a vertical grating region (60 or 60') located on a second side of the lithographic feature region. The second side is the opposite of the first side relative to the lithographic feature region (110, 120, 112, or 122). The reticle 102 is loaded in the exposure tool 300. The reticle can be any reticle 102 according to one of the embodiments of the present disclosure. A photoresist layer 420 on a substrate 109 is lithographically exposed in the exposure tool 300 employing the reticle 102 and at a setting in which the photoresist layer 420 is maintained at a distance from the lens 330 of the exposure tool 300. A lateral shift of a lithographic pattern of the lithographic feature region due to the horizontal and vertical grating regions is measured, for example, from a predetermined target location. The focus offset of the setting during the lithographic exposure can be determined based on the measured lateral shift.

In one embodiment, the lithographically exposure of the photoresist layer can be performed by polarizing an illumination radiation that impinges on the photoresist layer along a direction of polarization as discussed above. Both the magnitude of the vertical offset of a surface of the photoresist layer from a target height and the direction of the vertical offset can be simultaneously determined from the measured lateral shift because the magnitude and the direction of the lateral shift can be measured in the metrology tool 400.

While focus monitor structures employing phase shifting trenches formed on a reticle are known in the art, such focus monitors require formation of trenches in the reticles, thereby increasing the cost of manufacture for the mask. The focus monitor structures of the present disclosure do not require formation of any trenches within a substrate, and thus, does not increase the manufacturing cost of a reticle. Further, the focus monitor structures of the present disclosure enables not only the measurement of the magnitude of the focus offset, but also the measurement of the direction of the focus offset, which is a feature that prior art focus monitor structures fail to provide.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A reticle comprising a focus monitor structure, said focus monitor structure comprising one or more focus monitor units, wherein each of said one or more focus monitor units comprises:
   a substrate;
   a lithographic feature region having a same transmission coefficient for electromagnetic radiation throughout;
   a horizontal grating region formed on a top surface of the substrate and located on a first side of said lithographic feature region;
   a vertical grating region formed on the top surface of the substrate and located on a second side of said lithographic feature region,
   wherein said second side is an opposite of said first side relative to said lithographic feature region and is parallel with said first side, wherein said lithographic feature region has a first width defined as the vertical distance between said first side and said second side,
   wherein said first side and said second side have a same length along said lithographic feature region, and said horizontal grating region and said vertical grating region are provided along the full extension of said length,
   an opaque layer formed on the top surface of the substrate and having a first side and a second side parallel with said first side, wherein said opaque layer has a second width defined as the vertical distance between said first side and said second side of the opaque layer,
   wherein said horizontal grating region extends vertically from said first side of said opaque layer, and
   wherein said first width of said lithographic feature region is equal to said second width of said opaque layer.

2. The reticle of claim 1, wherein said lithographic feature region comprises a transparent region of said reticle.

3. The reticle of claim 2, wherein said transparent region is laterally bounded by a set of parallel edges, wherein said horizontal grating region contacts a first edge among said set of parallel edges, and wherein said vertical grating region contacts a second edge among said set of parallel edges.

4. The reticle of claim 1, wherein said lithographic feature region comprises an opaque region of said reticle.

5. The reticle of claim 4, wherein said opaque region is laterally bounded by a set of parallel edges and contacts a grating selected from:
   a horizontal grating in said horizontal grating region; and
   a vertical grating in said vertical grating region.

6. The reticle of claim 1, wherein said one or more focus monitor units is a plurality of focus monitor units having a periodicity along a direction of said horizontal gratings in said horizontal grating region.

7. The reticle of claim 1, wherein said focus monitor structure further comprises a reference structure that does not have any grating regions on peripheries thereof.

8. A reticle comprising a focus monitor structure, said focus monitor structure comprising a first focus monitor unit and a second focus monitor unit,
   wherein said first focus monitor unit comprises:
      a substrate;
      a first lithographic feature region having a same transmission coefficient throughout for electromagnetic radiation;
      a first horizontal grating region formed on a top surface of the substrate and located on a first side of said first lithographic feature region;
      a first vertical grating region formed on the top surface of the substrate and located on a second side of said first lithographic feature region,
      wherein said second side is an opposite of said first side relative to said first lithographic feature region and is parallel with said first side, wherein said lithographic feature region has a first width defined as the vertical distance between said first side and said second side; and
      wherein said first side and said second side have a same length along said first lithographic feature region, and said first horizontal grating region and said first vertical grating region are provided along the full extension of said length,
      an opaque layer formed on a top surface of the substrate and having a first side and a second side parallel with said first side, wherein said opaque layer has a second width defined as the vertical distance between said first side and said second side of the opaque layer,
      wherein said horizontal grating region extends vertically from said first side of said opaque layer, and
      wherein said first width of said lithographic feature region is equal to said second width of said opaque layer
   wherein said second focus monitor unit comprises:
      a second lithographic feature region having said same transmission coefficient for electromagnetic radiation throughout;
      a second vertical grating region located on one side of said second lithographic feature region; and a second horizontal grating region located on an opposite side of said second lithographic feature region,
wherein a relative location of said first horizontal grating region with respect to said first lithographic feature region is in an opposite direction of a relative location of said second horizontal grating region with respect to said second lithographic feature region.

9. The reticle of claim 8, wherein each of said first and second lithographic feature regions comprises a transparent region of said reticle.

10. The reticle of claim 8, wherein each of said first and second lithographic feature regions comprises an opaque region of said reticle.

11. A lithographic system comprising an exposure tool and a reticle, wherein said exposure tool is configured to print a periodic one-dimensional array of lines and spaces at a pitch not less than a minimum lithographic pitch, wherein said reticle comprises a focus monitor structure, wherein said focus monitor structure includes:
a substrate;
a lithographic feature region having a same transmission coefficient for electromagnetic radiation throughout;
a horizontal grating region formed on a top surface of the substrate and located on a first side of said lithographic feature region;
a vertical grating region formed on the top surface of the substrate and located on a second side of said lithographic feature region, said second side being an opposite of said first side relative to said lithographic feature region and being parallel with said first side,
wherein said first side and said second side have a same length along said lithographic feature region, and said horizontal grating region and said vertical grating region are provided along the full extension of said length, wherein said lithographic feature region has a first width defined as the vertical distance between said first side and said second side,
an opaque layer formed on the top surface of the substrate and having a first side and a second side parallel with said first side, wherein said opaque layer has a second width defined as the vertical distance between said first side and said second side of the opaque layer,
wherein said horizontal grating region is integral with said opaque layer and extends vertically from said first side of said opaque layer, and
wherein said first width of said lithographic feature region is equal to said second width of said opaque layer.

12. The lithographic system of claim 11, wherein said reticle comprises a transparent substrate having a same thickness throughout an entirety thereof.

13. The lithographic system of claim 11, wherein said lithographic feature region comprises a transparent region of said reticle.

14. The lithographic system of claim 13, wherein said transparent region is laterally bounded by a set of parallel edges, wherein said horizontal grating region contacts a first edge among said set of parallel edges, and wherein said vertical grating region contacts a second edge among said set of parallel edges.

15. The lithographic system of claim 11, wherein said lithographic feature region comprises an opaque region of said reticle.

16. The lithographic system of claim 15, wherein said opaque region is laterally bounded by a set of parallel edges and contacts a grating selected from:
a horizontal grating in said horizontal grating region; and
a vertical grating in said vertical grating region.

17. The lithographic system of claim 11, wherein said horizontal grating region includes horizontal gratings having a first pitch that is less than said minimum lithographic pitch, and said vertical grating region includes vertical gratings having a second pitch that is less than said minimum lithographic pitch.

18. The lithographic system of claim 11, wherein said exposure tool comprises a light source configured to emit a polarized electromagnetic radiation, wherein a direction of polarization is selected from:
a direction that is parallel to a lengthwise direction of a horizontal grating within said horizontal grating region; and
a direction that is parallel to a lengthwise direction of a vertical grating within said vertical grating region.

19. A method of monitoring a focus offset of a lithographic system, said method comprising:
providing a reticle comprising a focus monitor structure, said focus monitor structure comprising:
a substrate;
a lithographic feature region having a same transmission coefficient for electromagnetic radiation throughout;
a horizontal grating region formed on a top surface of the substrate and located on a first side of said lithographic feature region;
a vertical grating region formed on the top surface of the substrate and located on a second side of said lithographic feature region, said second side being an opposite of said first side relative to said lithographic feature region and being parallel with said first side, wherein said lithographic feature region has a first width defined as the vertical distance between said first side and said second side,
wherein said first side and said second side have a same length along said lithographic feature region and said horizontal grating region and said vertical grating region are provided along the full extension of said length,
an opaque layer formed on the top surface of the substrate and having a first side and a second side parallel with said first side, wherein said opaque layer has a second width defined as the vertical distance between said first side and said second side of the opaque layer,
wherein said horizontal grating region is integral with said opaque layer and extends vertically from said first side of said opaque layer, and
wherein said first width of said lithographic feature region is equal to said second width of said opaque layer;
loading said reticle in an exposure tool;
lithographically exposing a photoresist layer on a substrate in said exposure tool employing said reticle and at a setting in which said photoresist layer is maintained at a distance from a lens of said exposure tool;
measuring a lateral shift of a lithographic pattern of said lithographic feature region due to said horizontal and vertical grating regions; and
determining a focus offset of said setting based on said lateral shift.

20. The method of claim 19, wherein said reticle further comprises:
another lithographic feature region having said same transmission coefficient for electromagnetic radiation throughout;
another vertical grating region located on one side of said another lithographic feature region;

another horizontal grating region located on an opposite side of said another lithographic feature region, wherein a relative location of said horizontal grating region with respect to said lithographic feature region is in an opposite direction of a relative location of said another horizontal grating region with respect to said another lithographic feature region.

21. The method of claim 19, wherein said lithographically exposing of said photoresist layer comprises polarizing an illumination radiation that impinges on said photoresist layer along a direction of polarization, wherein a direction of polarization is selected from:
   a direction that is parallel to a lengthwise direction of a horizontal grating within said horizontal grating region; and
   a direction that is parallel to a lengthwise direction of a vertical grating within said vertical grating region.

22. The method of claim 19, wherein said determining of said focus offset comprises:
   determining a magnitude of a vertical offset of a surface of said photoresist layer from a target height; and
   determining a direction of said vertical offset.

* * * * *